(12) United States Patent
Nazarian et al.

(10) Patent No.: US 9,620,206 B2
(45) Date of Patent: *Apr. 11, 2017

(54) MEMORY ARRAY ARCHITECTURE WITH TWO-TERMINAL MEMORY CELLS

(71) Applicant: Crossbar, Inc., Santa Clara, CA (US)

(72) Inventors: Hagop Nazarian, San Jose, CA (US); Sung Hyun Jo, Sunnyvale, CA (US); Wei Lu, Ann Arbor, MI (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/692,677

(22) Filed: Apr. 21, 2015

(65) Prior Publication Data
US 2015/0228334 A1 Aug. 13, 2015

Related U.S. Application Data

(63) Continuation-in-part of application No. 13/529,985, filed on Jun. 21, 2012, now Pat. No. 9,013,911, and
(Continued)

(51) Int. Cl.
*G11C 11/00* (2006.01)
*G11C 13/00* (2006.01)
(Continued)

(52) U.S. Cl.
CPC ........ *G11C 13/004* (2013.01); *G11C 11/1653* (2013.01); *G11C 11/1659* (2013.01);
(Continued)

(58) Field of Classification Search
CPC ........ G11C 2013/0071; G11C 13/0002; G11C 2213/77; G11C 13/003
See application file for complete search history.

(56) References Cited

U.S. PATENT DOCUMENTS 680,652 A 8/1901 Leonard
4,433,468 A 2/1984 Kawamata
(Continued)

FOREIGN PATENT DOCUMENTS

CN 101131872 A 2/2008
CN 101170132 A 4/2008
(Continued)

OTHER PUBLICATIONS

Office Action for U.S. Appl. No. 12/815,318 dated May 16, 2012.
(Continued)

*Primary Examiner* — Son Dinh
*Assistant Examiner* — Uyen B Tran
(74) *Attorney, Agent, or Firm* — Amin, Turocy & Watson, LLP

(57) ABSTRACT

A non-volatile memory device includes a word line extending along a first direction; a bit line extending along a second direction; a memory unit having a read transistor coupled to the bit line, at least one two-terminal memory cell, and a select transistor, the two-terminal memory cell having a first end coupled to the word line and a second end coupled to a gate of the read transistor. The second end of the two-terminal memory cell is coupled to a common node shared by a drain of the select transistor and the gate of the read transistor.

19 Claims, 19 Drawing Sheets

Related U.S. Application Data a continuation-in-part of application No. 14/573,770, filed on Dec. 17, 2014, which is a continuation of application No. 13/960,735, filed on Aug. 6, 2013, now Pat. No. 8,952,349, which is a continuation of application No. 13/149,757, filed on May 31, 2011, now Pat. No. 8,502,185.

(60) Provisional application No. 61/500,547, filed on Jun. 23, 2011.

(51) Int. Cl.
  *G11C 11/16* (2006.01)
  *G11C 11/56* (2006.01)
  *H01L 45/00* (2006.01)
  *H01L 27/24* (2006.01)

(52) U.S. Cl.
  CPC ...... *G11C 11/5678* (2013.01); *G11C 11/5685* (2013.01); *G11C 13/003* (2013.01); *G11C 13/0004* (2013.01); *G11C 13/0007* (2013.01); *G11C 13/0023* (2013.01); *G11C 13/0028* (2013.01); *G11C 13/0061* (2013.01); *G11C 13/0069* (2013.01); *H01L 27/2436* (2013.01); *H01L 45/085* (2013.01); *H01L 45/1233* (2013.01); *H01L 45/1266* (2013.01); *H01L 45/148* (2013.01); *G11C 2013/0071* (2013.01); *G11C 2213/15* (2013.01); *G11C 2213/33* (2013.01); *G11C 2213/56* (2013.01); *G11C 2213/74* (2013.01); *G11C 2213/78* (2013.01); *G11C 2213/79* (2013.01); *G11C 2213/82* (2013.01)

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 * | 9/2007 | Yasuda ................ G11C 11/16 365/148 |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |

(56) References Cited

U.S. PATENT DOCUMENTS

| | | |
|---|---|---|
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 * | 12/2013 | Nguyen .............. G11C 13/004 365/148 |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,854,859 B2 | 10/2014 | Chung |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu et al. |
| 2006/0028895 A1 | 2/2006 | Taussig et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 * | 1/2008 | Takashima .............. G11C 11/22 365/145 |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |

(56) References Cited

U.S. PATENT DOCUMENTS

| | | |
|---|---|---|
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1* | 1/2009 | Inaba ............... B82Y 10/00 257/2 |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1* | 9/2009 | Sato ............... H01L 27/24 365/148 |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1* | 6/2010 | Norman ............... H03G 1/0088 365/148 |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1* | 10/2010 | Scheuerlein ............ G11C 5/025 365/189.09 |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1* | 6/2012 | Ueda ............... G11C 11/1659 365/148 |
| 2012/0176831 A1 | 7/2012 | Xiao et al. |
| 2012/0205606 A1 | 8/2012 | Lee et al. |
| 2012/0205793 A1 | 8/2012 | Schieffer et al. |

(56) References Cited

U.S. PATENT DOCUMENTS

| | | |
|---|---|---|
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1* | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1* | 9/2014 | Nazarian ............ G11C 13/0069 365/148 |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2016/0111640 A1 | 4/2016 | Chang et al. |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 2/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 A | 1/2008 |
| JP | 2008147343 A | 6/2008 |
| JP | 2009043873 A | 2/2009 |
| JP | 2011-23645 A1 | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 10-2009-0051206 A | 5/2009 |
| KR | 20110014248 A | 2/2011 |
| WO | 3034498 A1 | 4/2003 |
| WO | 2005124787 A2 | 12/2005 |
| WO | 2009005699 A1 | 1/2009 |
| WO | 2010026654 A1 | 3/2010 |
| WO | 2010042354 A1 | 4/2010 |
| WO | 2010042732 A2 | 4/2010 |
| WO | 2011008654 A1 | 1/2011 |
| WO | WO 2011/005266 A1 | 1/2011 |
| WO | 2011133138 A1 | 10/2011 |

OTHER PUBLICATIONS

International Search Report for PCT/US2011/046036 filed on Jul. 29, 2011.
Written Opinion of the International Searching Authority for PCT/US2011/046036 filed on Jul. 29, 2011.
Office Action for U.S. Appl. No. 12/900,232 dated Jul. 30, 2012.
Notice of Allowance for U.S. Appl. No. 13/051,296 dated Aug. 31, 2012.
Notice of Allowance for U.S. Appl. No. 12/900,232 dated Sep. 18, 2012.
Notice of Allowance for U.S. Appl. No. 12/815,318 dated Nov. 29, 2012.
International Search Report and Written Opinion for PCT/US2012/044077 filed on Jun. 25, 2012.
Office Action for U.S. Appl. No. 13/651,169 dated Mar. 7, 2013.
Office Action for U.S. Appl. No. 13/174,077 dated Apr. 1, 2013.
Office Action for U.S. Appl. No. 13/764,710 dated Aug. 9, 2013.
Notice of Allowance for U.S. Appl. No. 13/481,696 dated Sep. 30, 2013.
International Search Report and Written Opinion for PCT/US2013/042746 filed on May 24, 2013.
Notice of Allowability for U.S. Appl. No. 13/651,169 dated Oct. 28, 2013.
Notice of Allowance for U.S. Appl. No. 13/194,500 dated Oct. 28, 2013.
Office Action for U.S. Appl. No. 13/194,479 dated Sep. 25, 2013.
Liu, Ming et al., "rFGA: CMOS-Nano Hybrid FPGA Using RRAM Components", IEEE CB3 N17 International Symposium on Nanoscale Architectures, Jun. 12-13, 2008, pp. 93-98, Anaheim, USA.
Office Action for U.S. Appl. No. 13/525,096, dated Dec. 27, 2013.
Office Action for U.S. Appl. No. 13/531,449, dated Jun. 30, 2014.
Office Action for U.S. Appl. No. 14/166,691, dated Jul. 9, 2014.
International Search Report and Written Opinion for PCT Patent Application No. PCT/US2012/040232 filed on May 31, 2012.
Notice of Allowance for U.S. Appl. No. 13/585,759 dated Sep. 19, 2013.
Office Action for U.S. Appl. No. 13/921,157 dated Oct. 3, 2013.
Office Action for U.S. Appl. No. 13/960,735, dated Dec. 6, 2013.
International Search Report and Written Opinion for PCT/US2013/054976, filed on Aug. 14, 2013.
Notice of Allowance for U.S. Appl. No. 13/592,224, dated Mar. 17, 2014.
Office Action for U.S. Appl. No. 13/426,869 dated Sep. 12, 2014.
Notice of Allowance for U.S. Appl. No. 13/426,869 dated Oct. 21, 2014.
Notice of Allowance for U.S. Appl. No. 13/960,735, dated Sep. 17, 2014.
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Advisory Action mailed Jun. 8, 2012 for U.S. Appl. No. 12/835,704, filed Jul. 13, 2010.
Avila A., et al., "Switching in Coplanar Amorphous Hydrogenated Silicon Devices," Solid-State Electronics, 2000, vol. 44 (1), pp. 17-27.

(56) References Cited

OTHER PUBLICATIONS

Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, chapter 3, California Institute of Technology, Pasadena, 2007, pp. 79-120. Retrieved from the Internet:.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 812-813.
Dey S.K., "Electrothermal Model of Switching in Amorphous Silicon Films," Journal of Vacuum Science & Technology , 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Office Action for Application No. 11005649.6 dated Dec. 1, 2014, 2 pages.
European Office Action for Application No. 11005649.6 dated Nov. 17, 2015, 5 pages.
European Office Action for Application No. EP11005207.3 dated Aug. 8, 2012, 4 pages.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Hudgens S., et al., "Overview of Phase-Change Chalcogenide Nonvolatile Memory Technology", MRS Bulletin, Nov. 2004, pp. 829-832. Retrieved from the Internet.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet:.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "Analogue Memory and Ballistic Electron Effects in Metal-amorphous Silicon Structures," 3hilosophical Magazine, 1991, vol. 63 (1), pp. 349-369.
Hajto J., et al., "The Programmability of Amorphous Silicon Analogue Memory Elements," Materials Research Society Symposium Proceedings , 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", Systor'09; 20090504-20090406, May 4, 2009, pp. 1-9.
Hu., et al., "Area-Dependent Switching in Thin Film-Silicon Devices," Materials Research Society Symposium Proceedings, 2003, vol. 762, pp. A 18.3.1-A 18.3.6.
Hu., et al., "Switching and Filament Formation in hot-wire CVD p-type a-Si:H devices," Thin Solid Films, Science Direct, 2003, vol. 430, pp. 249-252.
Witten Opinion for Application No. PCT/US2009/061249, mailed on May 19, 2010, 3 pages.
Notice of Allowance for U.S. Appl. No. 14/611,022 dated Oct. 26, 2016, 41 pages.
Notice of Allowance for U.S. Appl. No. 14/509,967 dated Oct. 24, 2016, 42 pages.
Office Action for U.S. Appl. No. 14/597,151 dated Oct. 20, 2016, 52 pages.
Notice of Allowance for U.S. Appl. No. 14/383,079 dated Aug. 17, 2016, 71 pages.
Notice of Allowance for U.S. Appl. No. 14/612,025 dated Oct. 19, 2016, 108 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance mailed Sep. 18, 2014 for U.S. Appl. No. 13/586,815, filed Aug. 15, 2012.
Notice of Allowance mailed Jun. 19, 2012 for U.S. Appl. No. 12/861,650, filed Aug. 23, 2010.
Sune J., et al., "Nondestructive Multiple Breakdown Events in Very Thin Si02 Films," Applied Physics Letters, 1989, vol. 55, pp. 128-130.
Notice of Allowance mailed Apr. 2, 2013 for U.S. Appl. No. 13/149,757, filed May 31, 2011.
Notice of Allowance mailed Feb. 10, 2015 for U.S. Appl. No. 13/525,096, filed Jun. 15, 2012.

(56) References Cited

OTHER PUBLICATIONS

Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 23, 2013 for U.S. Appl. No. 13/417,135 filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Stikeman A., Polymer Memory—The Plastic Path to Better Data Storage, Technology Review, Sep. 2002, pp. 31. Retrieved from the Internet.
Shin W., et al., "Effect of Native Oxide on Polycrystalline Silicon CMP," Journal of the Korean Physical Society, 2009, vol. 54 (3), pp. 1077-1081.
Scott J.C., "Is There an Immortal Memory?," American Association for the Advancement of Science, 2004, vol. 304 (5667), pp. 62-63.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Rose M.J., et al., "Amorphous Silicon Analogue Memory Devices," Journal of Non-Crystalline Solids, 1989, vol. 115, pp. 168-170.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Office Action mailed Mar. 17, 2015 for U.S. Appl. No. 14/573,770.
Office Action mailed Apr. 19, 2011 for U.S. Appl. No. 12/582,086, filed Oct. 20, 2009.
Office Action mailed Aug. 19, 2013 for U.S. Appl. No. 13/585,759, filed Aug. 14, 2012.
Office Action mailed Jun. 19, 2012 for U.S. Appl. No. 13/149,757 filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S. Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.

(56) References Cited

OTHER PUBLICATIONS

Office Action mailed Sep. 30, 2013 for U.S. Appl. No. 13/189,401, filed Jul. 22, 2011.
Office Action mailed Nov. 26, 2012 for U.S Appl. No. 13/156,232.
Office Action mailed Aug. 27, 2013 for U.S. Appl. No. 13/436,714, filed Mar. 30, 2012.
Office Action mailed Mar. 30, 2011 for U.S. Appl. No. 11/875,541, filed Oct. 19, 2007.
Office Action mailed Mar. 27, 2012 for U.S. Appl. No. 13/314,513, filed Dec. 8, 2011.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.
Notice of Allowance dated Sep. 14, 2016 for U.S. Appl. No. 14/588,202, 119 pages.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
Office Action dated Aug. 23, 2016 for U.S. Appl. No. 14/613,585, 9 pages.
International Search Report and Written Opinion for Application No. PCT/US2012/040242, mailed on Jan. 31, 2013, 9 pages.
Zankovych S., et al., "Nanoimprint Lithography: Challenges and Prospects," Nanotechnology, 2001, vol. 12, pp. 91-95.
International Search Report and Written Opinion for Application No. PCT/US2012/045312, mailed on Mar. 29, 2013, 11 pages.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet:.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
Written Opinion for Application No. PCT/US2011/045124, mailed on May 29, 2012, 5 pages.
Jafar M., et al., "Switching in Amorphous-silicon Devices," Physical Review, 1994, vol. 49 (19), pp. 611-615.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feburary 9, 2015, 15 pages.
Japanese Search Report (English Translation) for Japanese Application No. 2011-153349 dated Feburary 9, 2015, 11 pages.
Japanese Search Report (English Translation) for Japanese Application No. 2014-513700 dated Jan. 14, 2016, 25 pages.
Jo S.H. et al., "High-Density Crossbar Arrays Based on a Si Memristive System", Supporting Information, 2009, pp. 1-4.

Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings , 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram {cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Written Opinion for Application No. PCT/US2011/040090, mailed on Feb. 17, 2012, 6 pages.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Sep. 9, 2016. https://www.yumpu.com/en/document/view/31750386/diffusion-1-color.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.

(56) References Cited

OTHER PUBLICATIONS

Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 13, 2010.
Notice of Allowance mailed Feb. 6, 2013 for U.S. Appl. No. 13/118,258, filed May 27, 2011.
Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.
Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087, filed Sep. 29, 2010.
Notice of Allowance mailed May 11, 2012 for U.S. Appl. No. 12/939,824, filed Nov. 4, 2010.
Notice of Allowance mailed Mar. 12, 2012 for U.S. Appl. No. 12/913,719, filed Oct. 27, 2010.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.
Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 16, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Written Opinion for Application No. PCT/US2009/060023, mailed on May 18, 2010, 3 pages.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Waser R., et al., "Nanoionics-based Resistive Switching Memories," Nature Materials, 2007, vol. 6, pp. 833-835.
Notice of Allowance mailed Sep. 17, 2014 for U.S. Appl. No. 13/462,653, filed May 2, 2012.
Terabe K., et al., "Quantized Conductance Atomic Switch," Nature, 2005, vol. 433, pp. 47-50.
Notice of Allowance mailed Sep. 18, 2014 for U.S. Appl. No. 13/920,021, filed Jun. 17, 2013.
Office Action for U.S. Appl. No. 14/887,050 dated Mar. 11, 2016, 12 pages.
Office Action for U.S. Appl. No. 15/046,172 dated Apr. 20, 2016, 8 pages.
Owen A.E., et al., "Switching in Amorphous Devices," International Journal of Electronics, 1992, vol. 73 (5), pp. 897-906.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Apr. 6, 2015 for U.S. Appl. No. 14/034,390, filed Sep. 23, 2013.
Office Action mailed Dec. 6, 2013 for U.S. Appl. No. 13/564,639, filed Aug. 1, 2012.
Owen A.E., et al., "Memory Switching in Amorphous Silicon Devices," Journal of Non-Crystalline Solids, 1983, vol. 50-60 (Pt2), pp. 1273-1280.
Office Action mailed Feb. 6, 2014 for U.S. Appl. No. 13/434,567, filed Mar. 29, 2012.
Office Action mailed Mar. 6, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S Appl. No. 13/436,714, filed Mar. 30, 2012.

(56) References Cited

OTHER PUBLICATIONS

Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Office Action mailed May 7, 2013 for U.S. Appl. No. 13/585,759, filed Aug. 14, 2012.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Jul. 9, 2015 for U.S. Appl. No. 14/573,817.
Office Action mailed Jul. 9, 2013 for U.S. Appl. No. 13/447,036, filed Apr. 13, 2012.
Office Action mailed May 20, 2016 for U.S. Appl. No. 14/613,299.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action dated Aug. 12, 2016 for U.S. Appl. No. 14/667,346, 27 pages.
Office Action mailed Mar. 12, 2014 for U.S. Appl. No. 13/167,920, filed Jun. 24, 2011.
Office Action mailed Apr. 8, 2016 for U.S. Appl. No. 14/573,770.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action dated Aug. 12, 2016 for U.S. Appl. No. 14/613,301, 43 pages.
Office Action mailed Mar. 14, 2012 for U.S. Appl. No. 12/815,369, filed Jun. 14, 2010.
Office Action mailed Mar. 14, 2014 for U.S. Appl. No. 12/835,704 filed, Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed Sep. 30, 2013 for U.S. Appl. No. 13/462,653, filed May 2, 2012.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Office Action for U.S Appl. No. 14/588,136 dated Nov. 2, 2016, 132 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.

\* cited by examiner

MEMORY ARRAY ARCHITECTURE WITH TWO-TERMINAL MEMORY CELLS

CROSS-REFERENCES TO RELATED APPLICATIONS

The present patent application claims priority to and is a continuation-in-part of U.S. application Ser. No. 13/529,985 filed Jun. 21, 2012. The present patent application claims priority to and is a continuation-in-part of U.S. application Ser. No. 14/573,770 filed Dec. 17, 2014, that is a continuation of U.S. patent application Ser. No. 13/960,735, filed Aug. 6, 2013, now U.S. Pat. No. 8,952,349 issued Feb. 10, 2015, which is a continuation of U.S. patent application Ser. No. 13/149,757, filed May 31, 2011, now U.S. Pat. No. 8,502,185 issued Aug. 6, 2013. The cited applications are herein by incorporated by reference, for all purposes.

BACKGROUND

The present invention relates to a memory array architecture including two-terminal memory cells, e.g., resistive memory cells.

A resistive random-access memory (RRAM) is a type of a resistive memory and has generated significant interest recently as a potential candidate for ultra-high density non-volatile information storage. A typical RRAM device has an insulator layer provided between a pair of electrodes and exhibits electrical pulse induced hysteretic resistance switching effects.

The resistance switching has been explained by the formation of conductive filaments inside the insulator layer due to Joule heating and electrochemical processes in binary oxides (e.g. NiO and $TiO_2$) or redox processes for ionic conductors including oxides, chalcogenides, and polymers. The resistance switching has also been explained by field assisted diffusion of ions in $TiO_2$ and amorphous silicon (a-Si) films.

In the case of a-Si structures, electric field-induced diffusion of metal ions into the silicon leads to the formation of conductive filaments that reduce the resistance of the a-Si structure. These filaments remain after a biasing (or program) voltage is removed, thereby giving the device its non-volatile characteristic, and they can be removed by reverse flow of the ions back toward the metal electrode under the motive force of a reverse polarity applied voltage.

Resistive devices based on the a-Si structure, particularly, that formed on polysilicon, typically exhibit good endurance or life cycle. However, the endurance of the resistive device can be shortened if an excessive bias voltage is applied to the device during repeated write and erase cycles in part due to Joule heating and movements of an unnecessarily large number of metal ions in the a-Si structure. Furthermore, in general, RRAM device yield is affected by an electroforming process during which a major pan of a conducting path is formed inside a switching medium by applying a larger voltage (or current) signal to the device.

BRIEF SUMMARY OF THE INVENTION

The present invention relates to a memory array architecture including two-terminal memory cells, e.g., resistive memory cells. The memory array includes a plurality of memory units, each including a program/erase transistor, a read transistor, and at least one two-terminal memory cell such as RRAM.

In one embodiment, a non-volatile memory device includes a word line extending along a first direction; a bit line extending along a second direction; and a memory unit having a read transistor coupled to the bit line, at least one two-terminal memory cell, and a select transistor, the two-terminal memory cell having a first end coupled to the word line and a second end coupled to a gate electrode of the read transistor.

In another embodiment, a non-volatile memory device includes a plurality of memory units arranged in an array of rows and columns, the each memory unit having a plurality of resistive memory cells, each resistive memory cell having a first end and a second end. A plurality of word lines extends along a first direction and having a first group of word lines associated with a first row of memory units, a second group of word lines associated with a second row of memory units, and a third group of word lines associated with a third row of memory units. A plurality of bit lines extends along a second direction and having a first bit line associated with a first column of memory units, a second bit line associated with a second column of memory units, and a third bit line associated with a third column of memory units. A plurality of read transistors is provided, each read transistor being associated with one of the memory units and having a drain electrode coupled to one of the bit lines. A plurality of select transistors is provided, each select transistor being associated with one of the memory units. A plurality of select lines have a first select line coupled to gate electrodes of the select transistors associated with the first column of memory units, a second select line coupled to gate electrodes of the select transistors associated the second column of memory units, and a third select line coupled to gate electrodes of the select transistors associated with the third column of memory units. A plurality of source lines have a first source line coupled to source electrodes of select transistors associated with the first row of memory units, a second source line coupled to source electrodes of select transistors associated with the second row of memory units, and a third source line coupled to source electrodes of select transistors associated with the third row of memory units. The first terminals of the resistive memory cells are coupled to the corresponding word lines and the second terminals of the resistive memory cells are coupled to corresponding common nodes, each common node being shared by the drain electrode of one of the select transistor and the gate electrode of the corresponding read transistor.

In another embodiment, a memory unit of a memory device includes a plurality of resistive memory cells; a select transistor having a drain electrode coupled to a common node, a gate electrode coupled to a select line, and a source electrode coupled to a source line; and a read transistor having a drain electrode coupled to a bit line and a gate electrode coupled to the common node. Each resistive memory cell has a first end coupled to a word line and a second end coupled to the common node, and a switching medium provided between the first and second ends.

In yet another embodiment, a method for programming a memory device includes providing a memory unit having a plurality of resistive memory cells, a select transistor having a drain electrode coupled to a common node, a gate electrode coupled to a select line, and a source electrode coupled to a source line, a read transistor having a drain electrode coupled to a bit line and a gate electrode coupled to the common node, wherein each resistive memory cell has a first end coupled to a word line and a second end coupled to the common node, and a switching medium provided between the first and second ends. The method further includes selecting at least one resistive memory cell; and applying a first potential to the word line associated with the selected memory cell with respect to the common node.

In yet another embodiment, the first potential is a positive potential. The method further includes applying the program voltage to the word line associated with the selected memory cell; and applying a select voltage to the gate electrode of the select transistor to turn on the select transistor.

In yet another embodiment, the first potential corresponds to a read voltage sufficient to cause electrical current to flow through the selected resistive memory cell if the selected resistive memory cell is in a low resistive state, the read voltage not being sufficient to change a resistive state of the selected memory cell.

In yet another embodiment, the first potential is a negative potential. The method further includes applying an erase voltage to the source line; applying about 0 volt to the word line associated with the selected memory cell; and applying a select voltage to the gate electrode of the select transistor to turn on the select transistor.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to a memory array architecture including two-terminal memory cells, e.g., resistive memory cells. The memory array includes a plurality of memory units, each including a program/erase transistor, a read transistor, and at least one two-terminal memory cell. The two-terminal memory cells include RRAM, phase-change memory, magnetoresistive random access memory (MRAM), spin-transfer torque RAM (STT-RAM), and the like.

Figure 1:
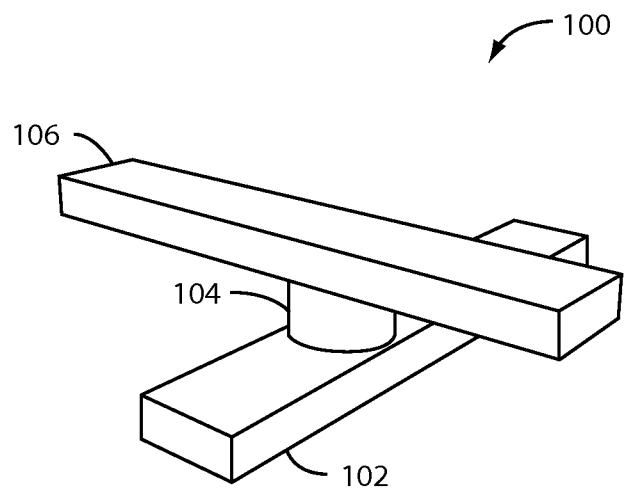
FIG. 1 illustrates a non-volatile memory device including a bottom electrode, a switching medium, and a top electrode according an embodiment of the present invention.

FIG. 1 illustrates a non-volatile memory device 100 including a bottom electrode 102, a switching medium 104, and a top electrode 106 according an embodiment of the present invention. The switching medium 104 exhibits a resistance that can be selectively set to various values, and reset, using appropriate control circuitry. The device 100 is a two-terminal resistive memory device. e.g., a resistive random-access memory (RRAM), in the present embodiment. As will be appreciated by one skilled in art, the device 100 may also be used as other types of devices such as a programmable variable capacitor.

The resistive memory device is a two-terminal device having a switching medium provided between top and bottom electrodes. The resistance of the switching medium can be controlled by applying an electrical signal to the electrodes. The electrical signal may be current-based or voltage-based. As used herein, the term "RRAM" or "resistive memory device" or "resistive memory cell" refers to a memory device that uses a switching medium whose resistance can be controlled by applying an electrical signal without ferroelectricity, magnetization and phase change of the switching medium.

In the present embodiment, the device 100 is an amorphous-silicon-based resistive memory device and uses amorphous silicon (a-Si) as the switching medium 104. The resistance of the switching medium 104 changes according to formation or retrieval of a conductive filament inside the a-Si switching medium 104 according to a voltage applied. The top electrode 106 is a conductive layer containing silver (Ag) and acts as a source of filament-forming ions in the a-Si switching medium 104. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). The bottom electrode 102 is a boron-doped or other p-type polysilicon electrode that is in contact with a lower end face of the a-Si switching medium 104.

Figure 2A:
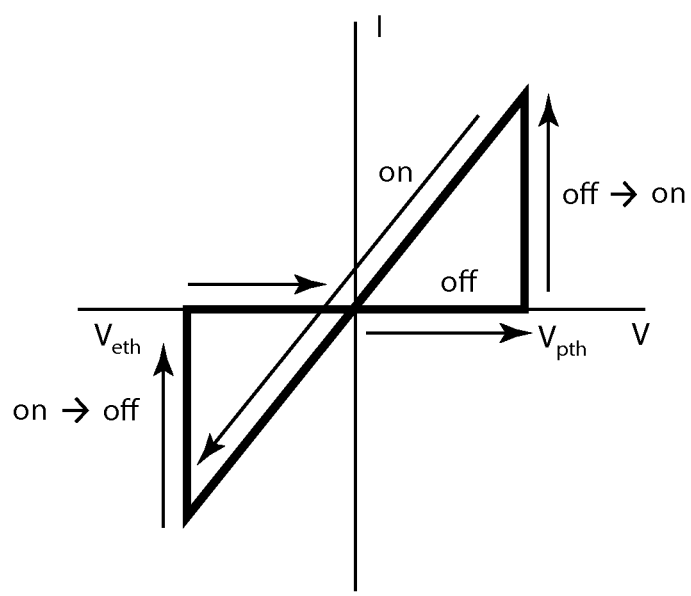
FIG. 2A illustrates resistance switching characteristics of the device according to an embodiment of the present invention.

FIG. 2A illustrates resistance switching characteristics of the device 100 according to an embodiment of the present invention. The switching medium 104 displays a bipolar switching mechanism. The resistance of the switching medium 104 changes depending on the polarity and magnitude of a current signal applied to the switching medium 104 via the top and bottom electrodes 106 and 102. The device 100 is changed into an ON-state (low resistance state) when a positive voltage equal to or greater than a program threshold voltage (or program voltage) Vpth is applied. In an embodiment, the program voltage ranges between 1 volt to 5 volts depending on the materials used for the switching medium 104 and the top electrode 106. The device 100 is switched back to an OFF-state (high resistance state) when a negative voltage equal to or greater than an erase threshold voltage (or erase voltage) Veth is applied. In an embodiment, the erase voltage ranges from −1 volts to −5 volts. The device state is not affected if the voltage applied is between the two threshold voltages Vpth and Veth, which enables a low-voltage, read process. Once the device 100 is set to a specific resistance state, the device 100 retains information for a certain period (or retention time) without electrical power.

FIG. 2A illustrates non-rectifying switching characteristics of the device 100 according to an embodiment of the present invention. Electrical current flows from the top electrode 106 to the bottom electrode 102 when the top electrode 106 is applied with a positive potential with respect to the bottom electrode 102. On the other hand, the current flows in a reverse direction if the top electrode 106 is applied with a negative potential with respect to the bottom electrode 102.

Figure 2B:
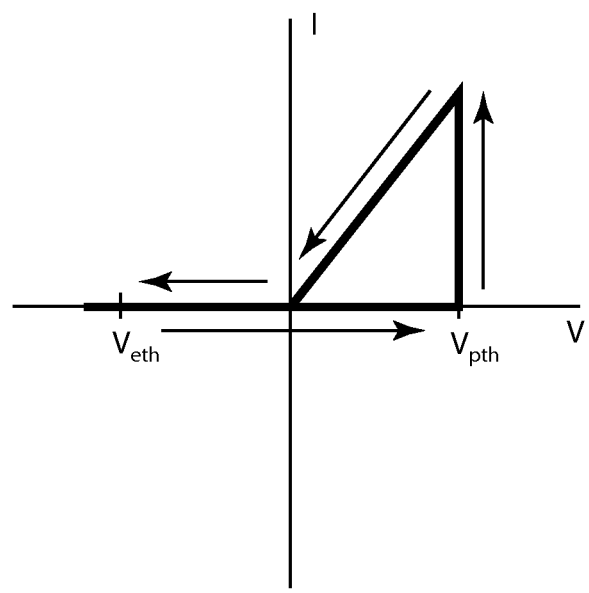
FIG. 2B illustrates resistance switching characteristics of the device according to an embodiment of the present invention.

FIG. 2B, on the other hand, illustrates rectifying switching characteristics of the device 100 according to another embodiment of the present invention. Electrical current flows from the top electrode 106 to the bottom electrode 102 when the top electrode 106 is applied with a positive potential with respect to the bottom electrode 102, but the current does not flow in the reverse direction even if the top electrode 106 is applied with a negative potential with respect to the bottom electrode 102. Under this embodiment, the device 100 exhibits a diode-like behavior and can be represented with an equivalent circuit including a resistor connected in series with a diode. The device 100 can be controlled to exhibit either rectifying or non-rectifying characteristics by controlling the amount of current flowing through the device as will be explained in more detail later.

Figure 3A:
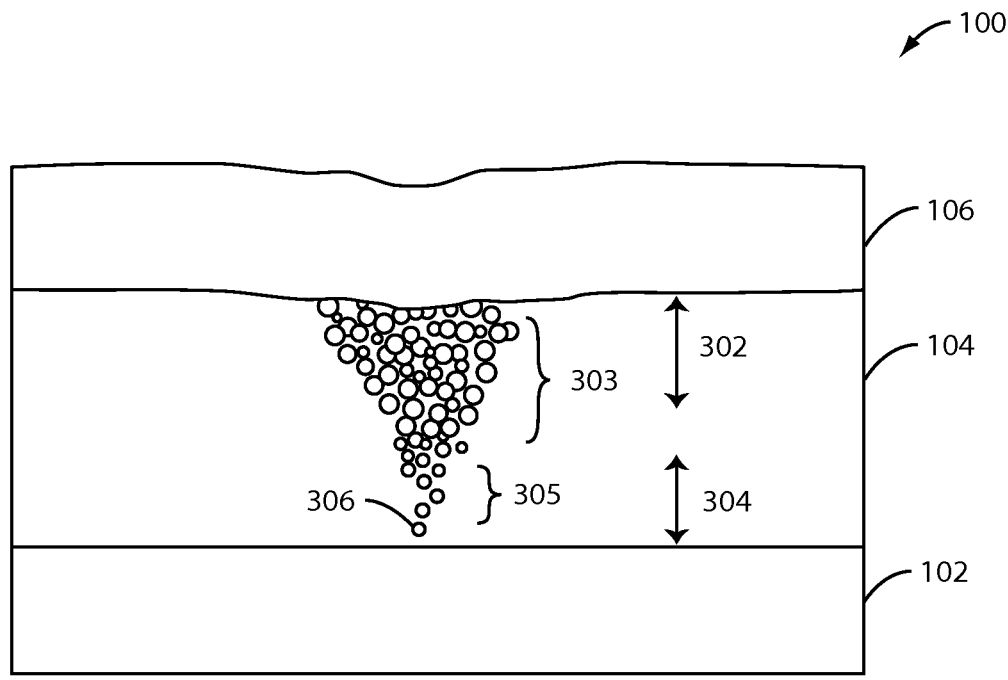
FIG. 3A illustrates a two-terminal device that is placed in an ON state by applying a program voltage Vpth to the top electrode.
Figure 3B:
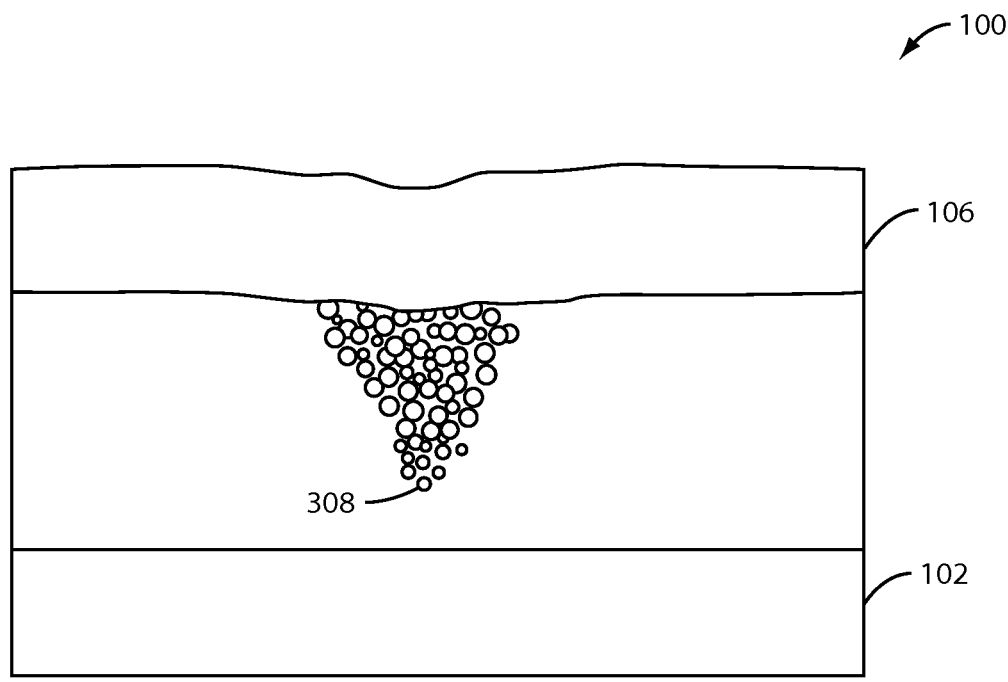
FIG. 3B illustrates a two-terminal device that is placed in an OFF state by applying an erase voltage Veth to the top electrode.

FIGS. 3A and 3B illustrate a switching mechanism of the device 100 during the ON and OFF states according to an embodiment of the present invention. The switching in the a-Si switching medium 104 is based on formation and retrieval of a conductive filament or a plurality of filaments in a filament region in the a-Si switching medium 104 according to the program and erase voltages applied to the electrodes 102 and 106 of the device 100.

FIG. 3A illustrates the device 100 that is placed in the ON state (or programmed state) by applying the program voltage Vpth to the top electrode 106. The switching medium 104 made of a-Si is provided between the bottom electrode 102 and the top electrode 106. An upper portion of the switching medium 104 includes a metallic region (or conductive path) 302 that extends from the top electrode 106 to about 10 nm above the bottom electrode 102. The metallic region 302 is formed during an electroforming process when a slightly larger voltage than a subsequent switching voltage, e.g., 1~5 V, is applied to the top electrode 106. This large voltage causes the electric field induced diffusion of the metal ions from the top electrode 106 toward the bottom electrode 102, thereby forming a continuous conductive path 303. A lower portion of the switching medium 104 defines a filament region 304 wherein a filament 305 is formed when the program voltage Vpth is applied after the electroforming process. The regions 303 and 305 can be also formed together during the electroforming process. The filament 305 includes a series of metal particles that are trapped in defect sites in the lower portion of the switching medium 104 when the program voltage Vpth applied provides sufficient activation energy to push a number of metal ions from the metallic region 302 toward the bottom electrode 102.

The filament 305 is believed to be comprised of a collection of metal particles that are separated from each other by the non-conducting switching medium and does not define a continuous conductive path, unlike the path 303 in the metallic region 302. The filament 305 extends about 2~10 nm depending on implementation. The conduction mechanism in the ON state is electrons tunneling through the metal particles in the filament 305. The device resistance is dominated by the tunneling resistance between a metal particle 306 and the bottom electrode 102. The metal particle 306 is a metal particle in the filament region 304 that is closest to the bottom electrode 102 and is the last metal particle in the filament region 304 in the ON state.

FIG. 3B illustrates the device 100 that is placed in an OFF state (or erased state) by applying the erase voltage Veth to the top electrode 106. The erase voltage Veth exerts a sufficient electromagnetic force to dislodge the metal particles trapped in the defect sites of the a-Si and retrieves at least part of the filament 305 from the filament region 304. A metal particle 308 that is closest to the bottom electrode 102 in the OFF state is separated from the bottom electrode 102 by a distance greater than the metal particle 306 during the ON state. This increased distance between the metal particle 308 and the bottom electrode 102 places the device 100 in a high resistance state compared to the ON state. In an embodiment, a resistance ratio between the ON/OFF states ranges from 10E3 to 10E7. The device 100 behaves like a resistor in the ON state and a capacitor in the OFF state. That is, the switching medium 104 does not conduct current in any meaningful amount and behaves basically as a dielectric in the OFF state. In an implementation, the resistance is 10E5 Ohm in the ON state and 10E10 Ohm in the OFF state. In another implementation, the resistance is 10E4 Ohm in the ON state and 10E9 Ohm in the OFF state. In yet another implementation, the resistance is at least 10E7 Ohm in the OFF state.

Referring back to FIGS. 2A and 2B, the device 100 can be controlled to exhibit a diode-like behavior by controlling the amount of current flowing through the device 100. If the amount of current flowing through the device 100 is less than a threshold amount, the device 100 exhibits a diode-like behavior, thereby preventing a reverse current flow from the bottom electrode 102 to the top electrode 106. In an embodiment, the threshold current is 10 µA so that the device 100 exhibits non-rectifying characteristics (see FIG. 2A) if the amount of current is 10 µA or more and rectifying characteristics (see FIG. 2B) if the amount of current is less than 10 µA. The threshold current varies according to the device implementation, e.g., the materials used and the size of the device 100.

It is believed that a negative potential applied to the bottom electrode 102 causes the metal particle 306 closest to the bottom electrode 102 (see FIG. 3A) to shift slightly upward without dislodging it from the filament region 304. The resulting increased distance between the metal particle 306 and the bottom electrode 102 increases the resistance and prevents the current from flowing from the bottom electrode 102 to the metal particle 306. If the current, however, is equal to or greater than the threshold level, the large current bursts through the metal particle 306 from the bottom electrode 102.

Figure 4:
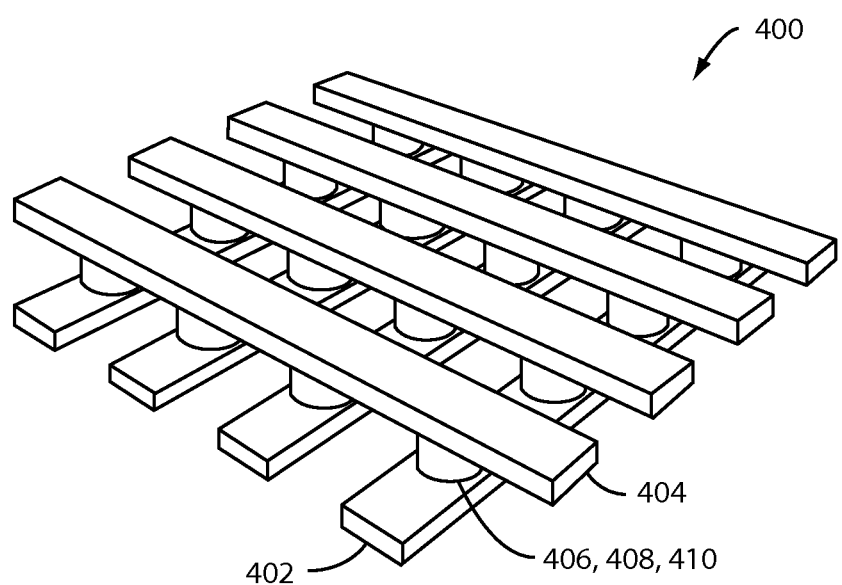
FIG. 4 illustrates a non-crystalline or amorphous silicon (a-Si) based crossbar memory array according to an embodiment of the present invention.

FIG. 4 illustrates a non-crystalline or a-Si based crossbar memory array 400 according to an embodiment of the present invention. The crossbar memory array 400 includes a parallel array of bottom electrodes 402 extending along a first direction. In an embodiment, the bottom electrodes 402 include a bottom metal (not shown) and a p-type polysilicon (not shown) formed on the bottom metal. The bottom electrodes 402 are nanoscale in the present embodiment. For example, the bottom electrodes 402 have a width of about 40 nm and a pitch of about 60 nm.

A parallel array of top electrodes 404 extends along a second direction to intersect the bottom electrodes 402. The top electrodes 404 include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes 404 and the bottom electrodes 402 are orthogonal to each other. The top electrodes 404 are nanowires having a width of about 60 nm and a pitch of about 150 nm.

Each intersection 406 of the two arrays 402 and 404 defines a two-terminal resistive memory cell 408. The memory cell 408 at each intersection 406 includes two electrodes 402 and 404 separated by a switching layer 410. The switching layer or structure can have a width substantially the same as or narrower than that of the bottom electrode 402. In some embodiments, each memory cell in a crossbar memory array can store a single bit. In other embodiments, the memory cells exhibit multi-level resistance thereby allowing storage of a plurality of bits at each cell.

In the present embodiment, the switching layer 410 includes amorphous silicon or other non-crystalline silicon. As used herein, the term "amorphous silicon" refers to silicon material that is in substantially amorphous phase and may include small grains of crystalline silicon. As used herein, the term "non-crystalline silicon" refers to amorphous silicon or amorphous polysilicon that exhibits controllable resistance, a combination thereof, or the like.

The crossbar memory array as described above may be fabricated on a silicon substrate in an embodiment. In another embodiment, ill-V type semiconductor compounds (such as gallium arsenide (GaAs), gallium nitride (GaN), boron nitride (BN), etc.) or II-VI type semiconductor compounds (such as cadmium selenide, zinc telluride, etc.) may also be used as the substrate.

Figure 5:
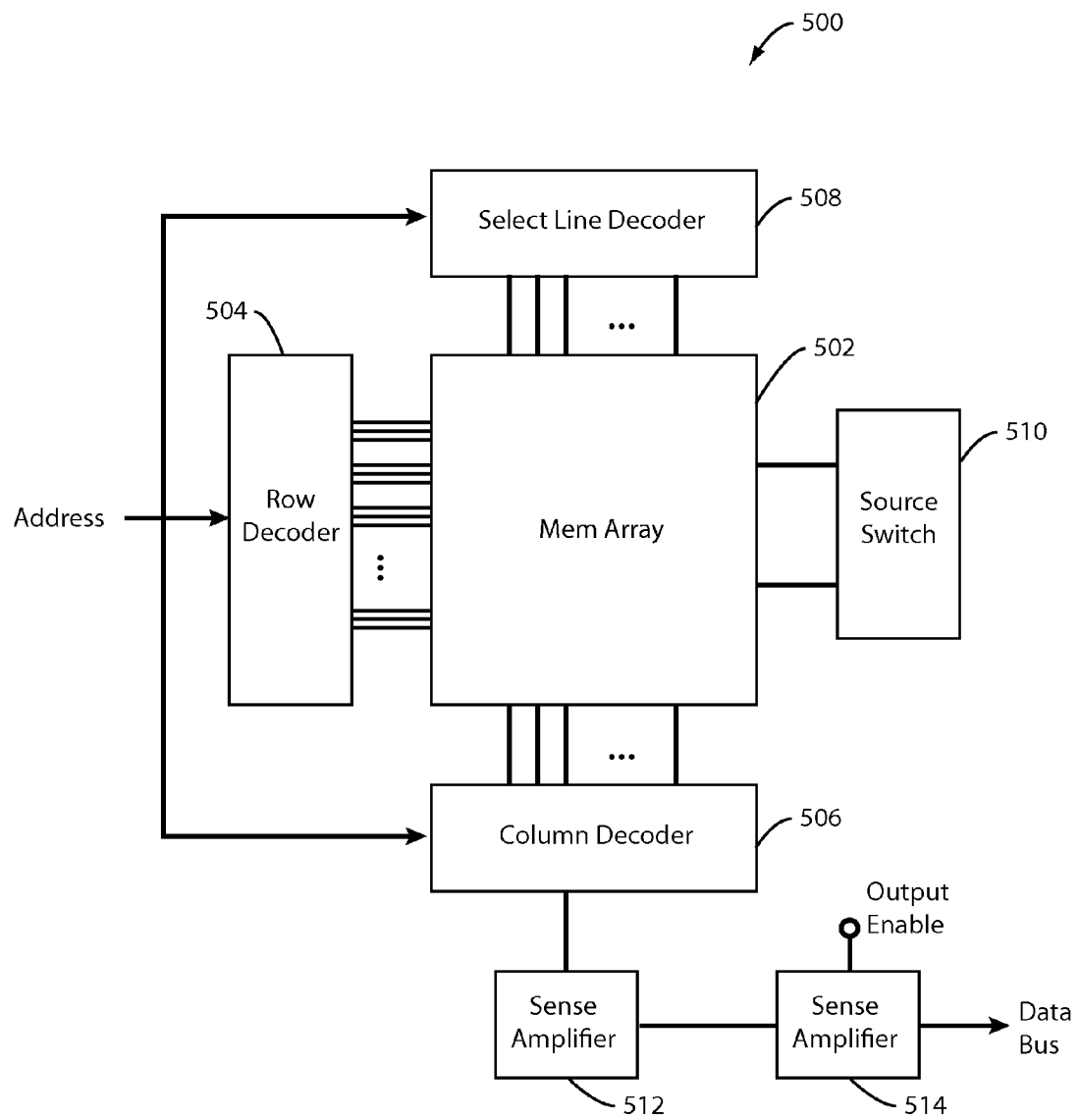
FIG. 5 illustrates a block diagram of a non-volatile memory device according to an embodiment of the present invention.

FIG. 5 illustrates a block diagram of a non-volatile solid state resistive switching device 500 according to an embodiment of the present invention. The device 500 includes a memory array 502 including a plurality of memory units. Each memory unit includes a plurality of resistive memory cells. In the present embodiment, the resistive memory cells are in a NOR configuration where each resistive memory cell can be accessed independently from other resistive memory cells in the same memory unit. In other embodiment, the resistive memory cells may be in a NAND, crossbar, or other configuration. A row decoder 504 receives the address of a resistive memory cell to be operated on and selects a word line associated with the resistive memory cell. A column decoder 506 receives the address of the resistive memory cell for an operation and selects a bit line associated with the resistive memory cell. A select line decoder 508 receives the address of the resistive memory cell and selects a select line associated with a memory unit including the resistive memory cell. A source switch 510 applies a voltage suitable for an operation to be performed on a source line of the memory unit. A sense amplifier 512 senses the current flowing through the bit line selected to determine whether or not a selected resistive memory cell of the memory unit has been programmed or erased. An output buffer 514 receives data sensed by the sense amplifier 512 and outputs the data to a data bus according to an output enable signal.

Figure 6:
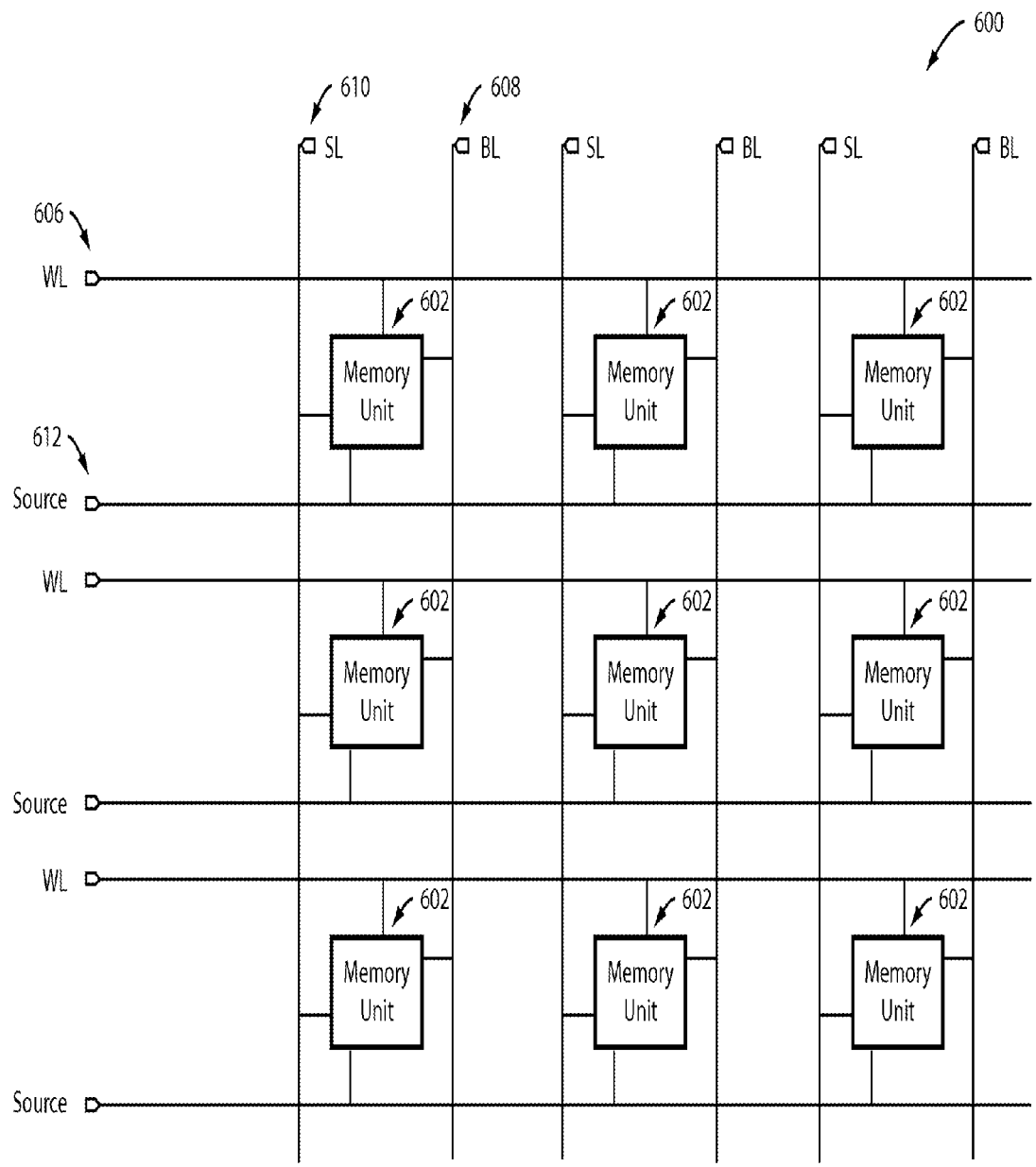
FIG. 6 illustrates a memory array including a plurality of memory units according to an embodiment of the present invention.

FIG. 6 illustrates a memory array 600 including a plurality of memory units 602 according to an embodiment of the present invention. Each memory unit 602 is uniquely identified by a word line 606, a bit line 608, and a select line 610. A source line 612 provides voltages suitable for performing a given operation. The source line 612 is not needed to identify the memory unit 602 in the present embodiment. In other embodiment, the source line 612 may be used to identify a specific memory unit 602.

Each memory unit 602 includes at least one resistive memory cells (See FIG. 7) for storing information. The resistive memory cell stores one or more bits depending on implementation. Each resistive memory cell is coupled to the word line 606. Although only one word line 606 is illustrated for each memory unit 602 in FIG. 6, any number of word lines may be provided for the memory unit 602 according to implementation. In an embodiment, each memory unit 602 has twelve (12) resistive memory cells and twelve (12) word lines associated thereto. In another embodiment, each memory unit 602 has thirty-two (32) resistive memory cells and thirty-two (32) word lines associated thereto. In yet another embodiment, each memory unit 602 has sixty-four (64) resistive memory cells and sixty-four (64) word lines associated thereto.

Figure 7:
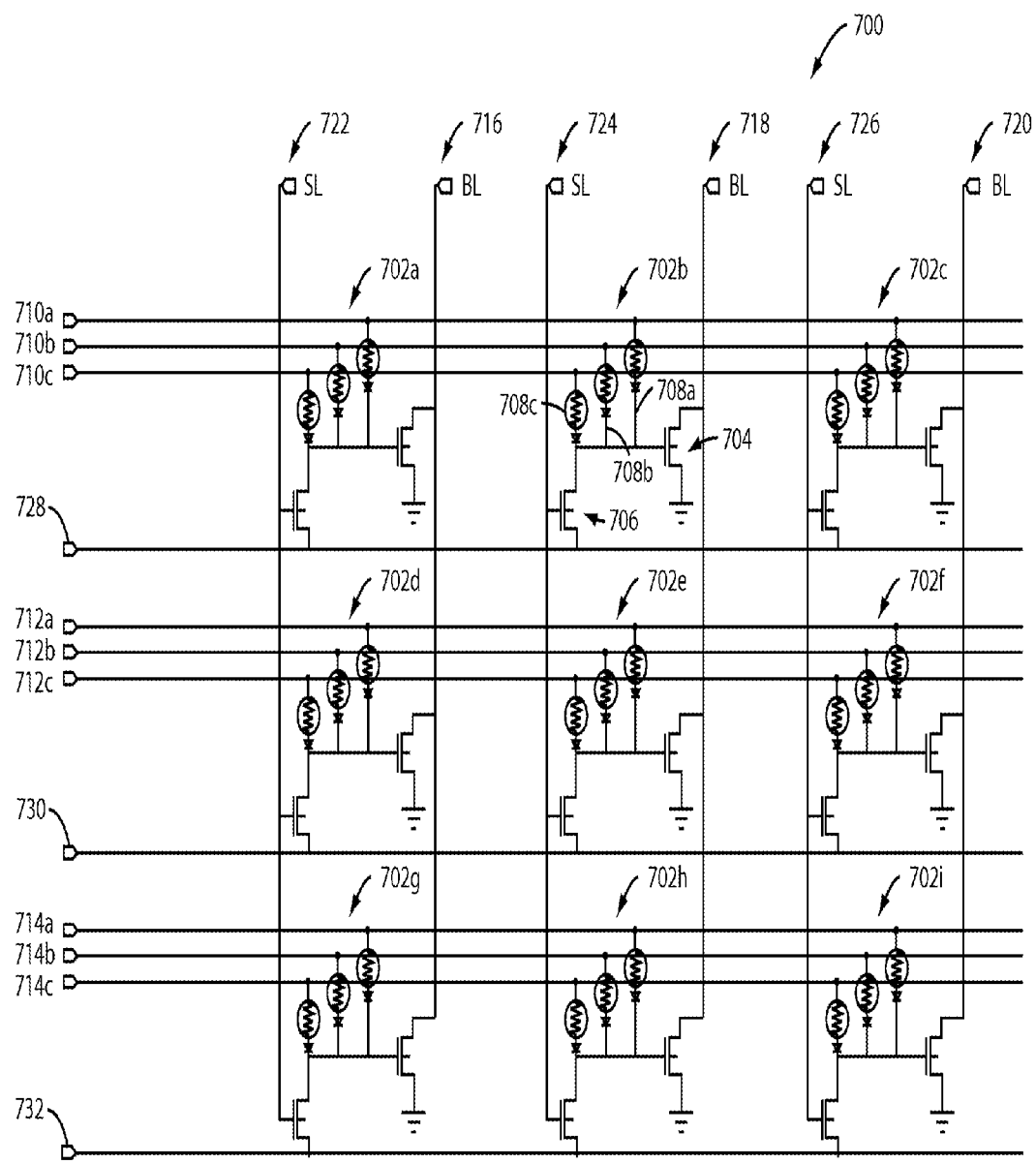
FIG. 7 illustrates a memory array including a plurality of memory units where each memory unit includes a read transistor, a plurality of resistive memory cells, and a select transistor according to an embodiment of the present invention.

FIG. 7 illustrates a memory array 700 including a plurality of memory units 702a-702i that are arranged an array of rows and columns according to an embodiment of the present invention. Each memory unit includes a read transistor 704, a program/erase transistor 706 (also referred to as a "select transistor"), and a plurality of resistive memory cells 708a. 708b, and 708c for storing data. Since data are stored in the resistive memory cells, the read transistor 704 is not required to be scaled down to a nano scale in order to provide the requisite device density, unlike those memory devices that use transistors to store data, e.g., Flash and DRAM memory devices.

A gate electrode of the read transistor 704 and a drain electrode of the program/erase transistor 706 share a common node. Bottom electrodes of the resistive memory cells 708a. 708b, and 708c are coupled to this common node connecting the gate electrode of the read transistor 704 and the drain electrode of the program/erase transistor 706. Each resistive memory cell in a memory unit may be programmed, erased, or read independently from other memory cells in the same memory unit. For illustrative convenience, only three resistive memory cells 708a, 708b, and 708c are shown for each memory unit, but their number can vary according to implementation.

In the present embodiment, the resistive memory cells 708a, 708b, and 708c are operated to exhibit diode-like characteristics so that an electrical current flows from the top electrode (e.g., the word line) to the bottom electrode (e.g., the common node connected to the gate electrode of the read transistor). Each resistive memory cell, therefore, exhibits characteristics of a resistor connected in series with a diode. This unidirectional current flow prevents problems associated with a sneak-path current without using an external diode that would require greater device fabrication complexity and larger device real estate.

Referring back to FIG. 7, the memory array 700 has word lines that are grouped according to the rows of memory units. A plurality of first word lines 710a, 710b, and 710c are associated with the memory units 702a. 702b, and 702c in a first row. Each of the first word lines is connected to the top electrode of one of memory cells of each memory unit in the first row. For example, the first word lines 710a, 710b, and 710c are connected to the resistive memory cells 708a, 708b, and 708c of the memory unit 702b, respectively. A plurality of second word lines 712a. 712b, and 712c are associated with the memory units 702d. 702e, and 702f in a second row. Each of the second word lines is connected to the top electrode of one of memory cells of each memory unit in the second row. A plurality of third word lines 714a, 714b, and 714c are associated with the memory units 702g, 702h, and 702i in a third row. Each of the third word lines is connected to the top electrode of one of memory cells of each memory unit in the third row.

In an embodiment, each group of word lines has the same number of word lines as the number of memory cells in a memory unit. For example, each group of word lines may have eight (8) word lines, sixteen (16) word lines, thirty-two (32) word lines, or sixty-four (64) word lines according to the number of memory cells provided in each memory unit. Depending on implementation, a page of data may be defined by each word line, each memory unit, or each row of memory units.

A first hit line 716 is connected to drains of read transistors of the memory units 702a. 702d, and 702g in a first column. A second bit line 718 is connected to drains of read transistors of the memory units 702b, 702e, and 702h in a second column. A third bit line 720 is connected to drains of read transistors of the memory units 702c, 702f, and 702i in a third column.

A first select line 722 is connected to gates of program/erase transistors of the memory units 702a. 702d, and 702g in a first column. A second select line 724 is connected to gates of program/erase transistors of the memory units 702b, 702e, and 702h in a second column. A third select line 726 is connected to gates of program/erase transistors of the memory units 702c. 702f, and 702i in a third column. In the present embodiment, a memory unit is selected for an operation by selecting a word line, a bit line, and a select line associated thereto.

A first source line 728 is connected to sources of program/erase transistors of the memory units 702a, 702b, and 702c in the first row. A second source line 730 is connected to sources of program/erase transistors of the memory units 702d, 702e, and 702f in the second row. A third source line 732 is connected to sources of program/erase transistors of the memory units 702g. 702h, and 702i in the third row. In the present embodiment, the source lines provide appropriate voltages to the program/erase transistors according to an operation to be performed on a selected resistive memory cell. In an embodiment, each memory unit is associated with at least one word line, a bit line, and a select line. In an embodiment, each memory unit has eight (8) memory cells and is associated with eight (8) word lines. In another embodiment, each memory unit has sixteen (16) memory cells and is associated with sixteen (16) word lines. In another embodiment, each memory unit has thirty-two (32) memory cells and is associated with thirty-two (32) word lines.

In operations, a resistive memory cell is operated, e.g., programmed, erased, or read, by applying predetermined voltages to word lines, bit lines, select lines, and source lines of the memory array 700 according to an operation to be performed. The memory array 700 reads fast since the resistive memory cells are provided between the word lines and the gate of the read transistor instead of in the path of the bit lines. Below is an operation table according to an embodiment of the present invention.

TABLE 1

| Operation | WL Selected | WL Unselected | Source Line | Select Line | BL Selected |
| --- | --- | --- | --- | --- | --- |
| Program | ~3 V (pulse) | 1.5 V or float | 0 V | 3 V | Float or 0 V |
| Erase | 0 V | Float or 4 V | 4 V | 4 V | Float or 0 V |
| Read | ~1.5 V (pulse) | Float or 0 V | 0 V | 0 V or Vref | Sense current or voltage |

The memory unit 702b is taken as an example, and the resistive memory cell 708a in the memory unit 702b is selected for programming. A select voltage is applied to the select line 724 and thus to the gate of the program transistor (or select transistor) 706. The channel region of the program transistor 706 becomes conductive. A first voltage (or the program voltage Vpth) is applied to the word line 710a connected to the resistive memory cell 708a by providing a potential difference between the word line 710a and the source line 728 connected to the source of the program transistor 706. A second voltage is applied to the word lines 710b and 710c that are connected to the unselected memory cells 708b and 708c.

In an embodiment, to program a cell, the first voltage of about 3 volts is applied to the word line 710a while the source line 728 is grounded. In another embodiment, the first voltage of about 1 volt is applied to the word line 710a while the source line 728 is grounded. The first voltage may be applied as voltage pulses. The second voltage having amplitude of no more than about half of that of the first voltage is applied to the word lines 710b and 710c. Alternatively, word lines associated with the unselected resistive memory cells can be maintained at float depending on the implementation. For amorphous silicon as the resistive switching material, the first voltage can range from about 0.5 volt to about 5 volts depending on the device dimension and process conditions of the amorphous silicon material, among others.

To erase a programmed cell, an erase voltage Veth having a polarity opposite to that of the program voltage Vpth is applied to programmed cell. The erase voltage Veth has amplitude that is about the same as or slightly greater than the program voltage Vpth.

The resistive memory cell 708a is taken as an example again. The erase voltage Veth (e.g., 4 volts) is applied between the source line 728 and the word line 710a by applying a positive voltage to the source line 728 while the word line 710a is maintained at about 0 volt. The select voltage is applied to the select line 724 to turn on the program transistor 706.

In an embodiment, the read transistor 704 is kept turned off during the program or erase operation since the bit line is used to read data. Bit line 718 is maintained at float or 0 volt.

A read operation is performed to determine a state of a resistive memory cell. The bit line 718 is used to measure the current flow through the selected resistive memory cell 708a. The resistance state of the selected memory cell 708a is determined based on this current flow amount.

During read operation, a read voltage is applied to the word line 710a to provide a potential difference between the word line 710a and the source line 728. In an embodiment, the read voltage has amplitude that is about half of that of the program voltage Vpth in order to prevent the read voltage from disturbing the resistive state of the memory cell being read. In an embodiment, the read voltage is 0.5 to 1.5 volt and is applied as voltage pulses. A voltage (e.g., 0.5 volt) is applied to the word lines 710b and 710c, which are associated with the unselected cells 708b and 708c. The voltage applied to the word lines 710b and 710c may vary according to implementation.

Figure 8:
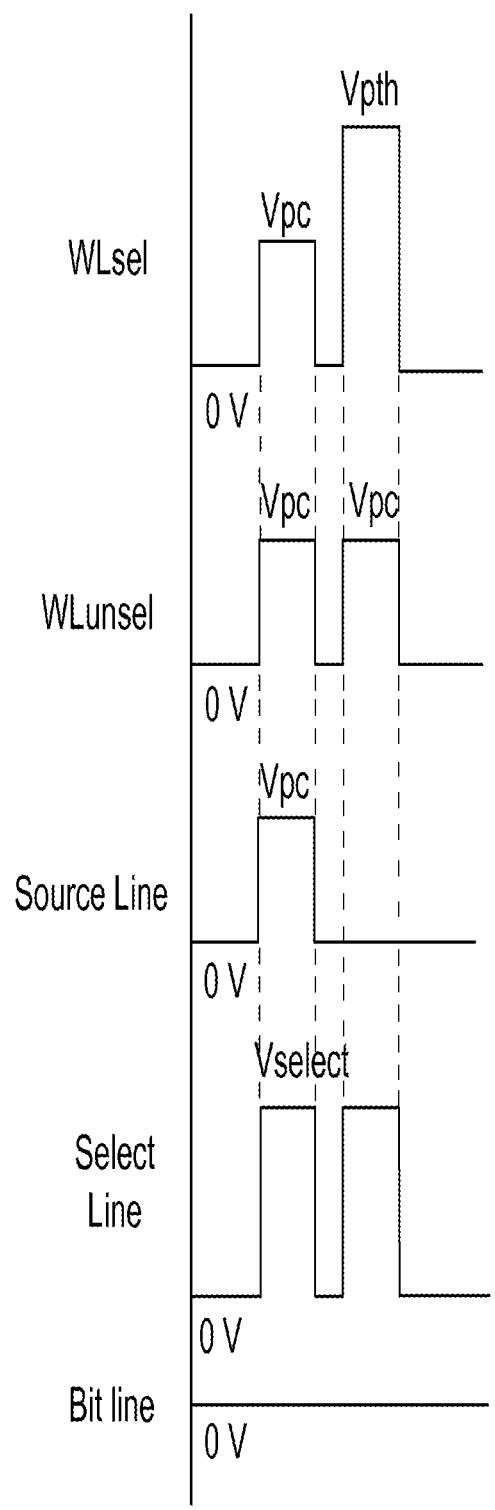
FIG. 8 illustrates a program operation of a memory device according to an embodiment of the present invention.

FIG. 8 illustrates a program operation of a memory device according to an embodiment of the present invention. Since memory cells are interconnected extensively, a leakage current can affect neighboring cells during a program, erase, or read operation. Accordingly, in an embodiment, a precharge operation is performed on the resistive memory cells before the program operation is performed. The precharge operation causes first and second terminals of each of the resistive memory cells in the same row to have substantially the same potential before the program operation. For example, if the resistive memory cell 708a in the memory unit 702b is selected for the programming, a precharge operation is performed to cause the first and second terminals of the resistive memory cells 708a, 708b, and 708c in the memory unit 702b to have a zero potential difference. The precharge operation includes applying a precharge voltage Vpc (or a first precharge voltage) to a selected word line WLsel, e.g., the word line 710a associated with the selected resistive memory cell 708a. The precharge voltage Vpc is also applied to unselected word lines WLunsel, e.g., the word lines 710b and 710c, that are in the same word line group and are associated with the memory units in the first row. Additionally, the precharge voltage Vpc (or second precharge voltage) is applied to the source line 728. In an embodiment, the first precharge voltage applied to the word lines WLsel and WLunsel and the second precharge voltage applied to the source line 728 are substantially the same. In other embodiments, the first and second precharge voltages may be different.

During the precharge operation, the second word lines 712a-712c and the third word lines 714a-714c that are associated with the memory units in the second row and the third row, respectively, are maintained at zero volt or float. The precharge voltage Vpc has amplitude that is less than the program voltage Vpth so as not unintentionally program the memory cells during the precharge operation. In an embodiment, the amplitude of precharge voltage Vpc is no more than about half of that of the program voltage. A voltage Vselect is applied to the select line 724 to turn on the program transistor 706 when the precharge voltage Vpc is applied to the word lines 710a. 710b, and 710c and the source line 728. As a result, the resistive memory cells 708a. 708b, and 708c in the memory unit 702b are at a precharged state.

Thereafter, the program voltage Vpth is applied to the word line 710a connected to the memory cell 708a in order to program it. The precharge voltage Vpc is no longer applied to the source line 728 and a voltage level of the source line 728 is reduced to a zero volt. The precharge voltage Vpc as is continued to be applied to the word lines 710b and 710c of the unselected resistive memory cells 708b and 708c. This precharge voltage Vpc (or inhibit voltage) is applied to inhibit the memory cells 708b and 708c from unintentionally be programmed by the program voltage Vpth applied to the selected resistive memory cell 708a.

Figure 9:
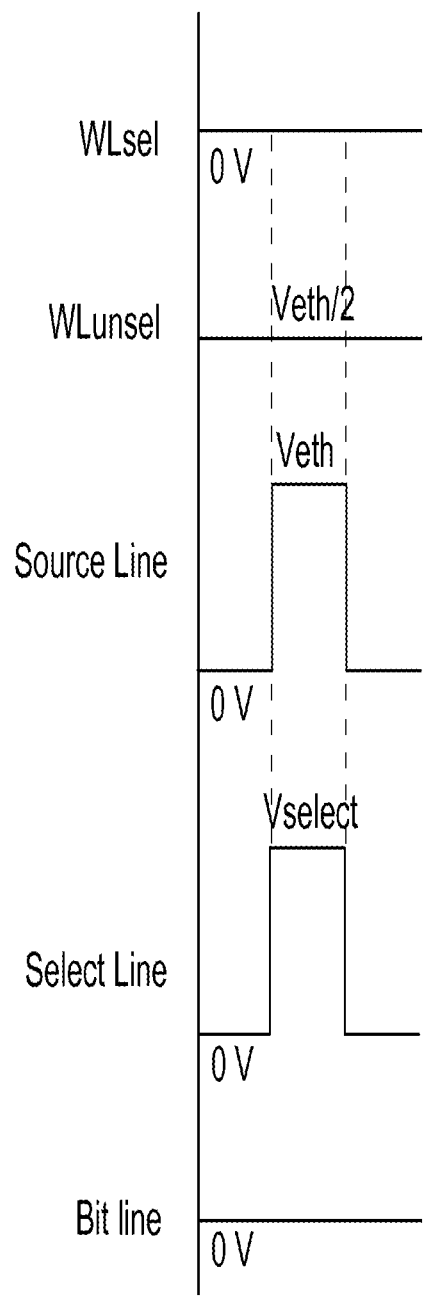
FIG. 9 illustrates a bit erase operation of a memory device according to an embodiment of the present invention.

FIG. 9 illustrates a bit erase operation of a memory device according to an embodiment of the present invention. The resistive memory cell 708a is taken as an example of a programmed cell. An erase voltage Veth is applied to the source line 728 while a zero volt is applied to a selected word line WLscl, e.g., the word line 710a associated with the selected resistive memory cell 708a. A select voltage Vselect applied to the select line 724 to turn on the program transistor 706. The negative potential difference between the word line 710a and the source line 728 cause the memory cell 710a to be erased. i.e., placed at a high resistive state. A voltage, e.g., about Veth/2, is applied to unselected word lines WLunsel, i.e., the word lines 710b and 710c associated with the unselected cells 708b and 708c to prevent the unselected resistive memory cells 708b and 708c from being erased unintentionally. In an embodiment, the select voltage Vselect is applied as voltage pulses.

Figure 10:
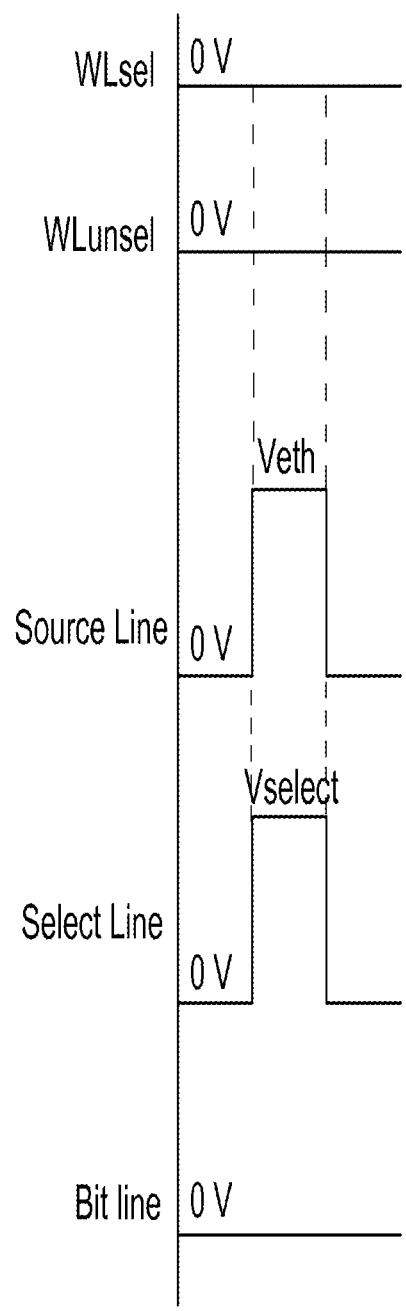
FIG. 10 illustrates a page erase operation of a memory device according to an embodiment of the present invention.

FIG. 10 illustrates a page erase operation of a memory device according to another embodiment of the present invention. The erase operation may be performed on a single cell, for example, the resistive memory cell 708a, as described above with reference to FIG. 9 or on a plurality of selected cells in a same row or a page, as illustrated in FIG. 10. In the present embodiment, the page is defined as all the memory cells of the memory units in the same row.

In a page erase operation, all the memory cells in the memory units 702a, 702b, and 702c are erased at the same time. A zero volt is applied to all the word lines WLsel in the same row. i.e., the first word lines 710a. 710b, and 710c. A source voltage equivalent to the erase voltage Veth is applied to the source line 728. A select voltage Vselect is applied to the select lines 722, 724, and 726, in order to turn on the program/erase transistors of the memory units 702a, 702b, and 702c. All the memory cells of the memory units in the same row are erased at the same time since all of them are applied with the erase voltage. At this time, a zero voltage is applied to the bit lines 716, 718, and 720. Alternatively, the bit lines 716, 718, and 720 may be maintained at float.

In an embodiment, a page may be defined as all the memory cells of a single memory unit. The page erase operation is performed in a similar manner as in FIG. 10, one difference being that the select voltage Vselect is only applied to the select line associated with the memory unit to be erased. In another embodiment, a page is defined as all the memory cells connected to the same word line. The page erase operation can be performed in a similar manner as in FIG. 10, one difference being that the unselected word lines (e.g., 710b and 710c) of the same group are applied with an inhibit voltage. e.g., 1.5 volt, to prevent the memory cells connected to these unselected word lines from being erased.

Figure 11:
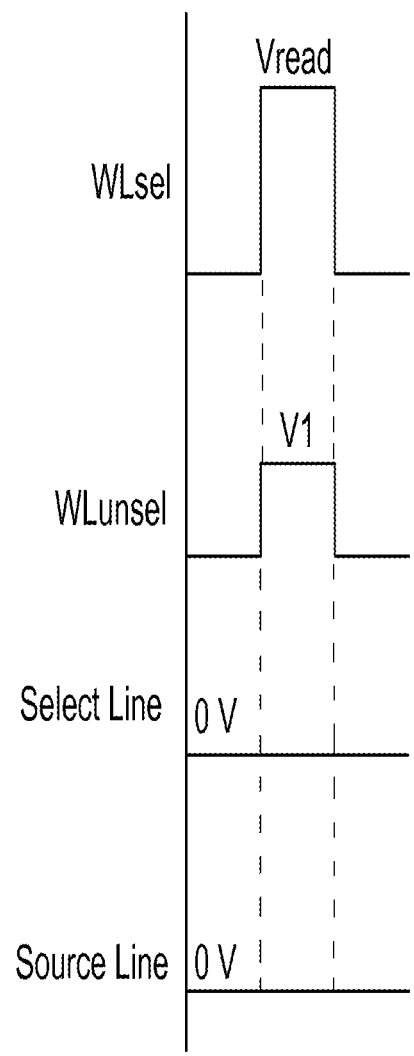
FIG. 11 illustrates a read operation of a memory device according to an embodiment of the present invention.
Figure 12:
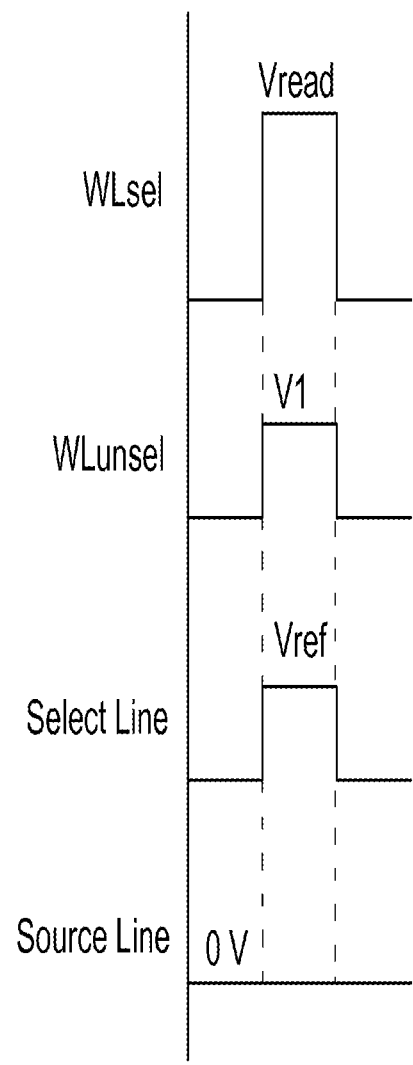
FIG. 12 illustrates a read operation of a memory device according to another embodiment of the present invention.
Figure 13:
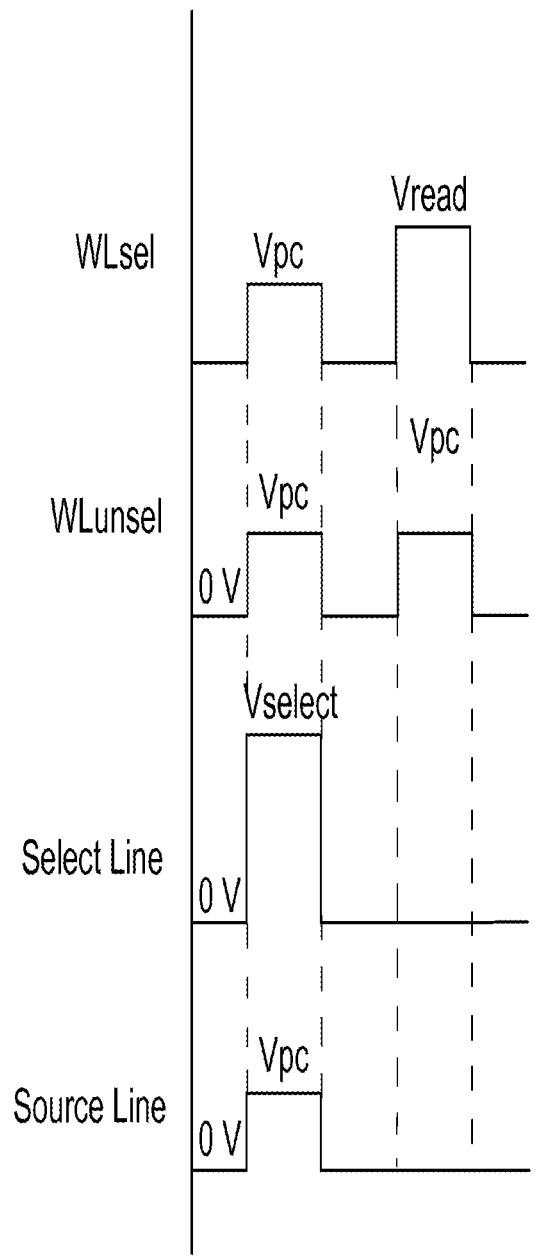
FIG. 13 illustrates a read operation of a memory device according to another embodiment of the present invention.

FIGS. 11, 12, and 13 illustrate various ways to implement a read operation to determine the bit value of a resistive memory cell according to embodiments of the present invention. As memory cells in a memory array are interconnected using a bottom electrode and a top electrode as illustrated in FIG. 4, a read voltage applied to a selected cell should not inadvertently erase or program the memory cells. The read operation may be implemented with or without pre-charging the selected word lines or the selected source line. In the examples herein, the memory cell 708a of the memory unit 702b is assumed to have been selected for the read operation (see FIG. 7).

In an embodiment, no precharge voltage is applied before the read operation is performed on the memory cell 708a (see FIG. 11). A voltage V1, which is no more than the read voltage Vread, is applied to word lines WLunsel, i.e., the word lines 710b and 710c, associated with the unselected memory cells 708b and 708c in the memory unit 702b. A read voltage Vread is applied to a selected word line WLsel, i.e., the word line 710a, connected to the selected memory cell 708a while maintaining the source line 728 at a zero volt to. The read voltage Vread is selected to have amplitude (e.g., 0.5-1.5 volt) that would not inadvertently program or erase the resistive memory cell 708a. In an embodiment, the amplitude of the read voltage Vread is no more than half of that of the program voltage Vpth.

The potential difference caused by the read voltage Vread between the word line 710a and the source line 728 causes a current to flow through the selected memory cell 708a if it is in a programmed state (or low resistance state). This current (or the read voltage), in turn, turns on the read transistor 704 and causes current to flow through the read transistor 704, which would be sensed by a load or a sense circuitry (not shown) coupled to the bit line 718. The sense circuitry may be a current sensor or a voltage sensor according to implementation.

On the other hand, if the memory cell 708a is in an erased state (or high resistance state), little or no current would flow through the memory cell 708a even if the read voltage Vread is applied to the word line 710a. The read transistor 704 would remain turned off and the sense circuitry would not sense a necessary amount of current flow.

FIG. 12 illustrates a read operation according to another embodiment of the present invention. A reference voltage Vref is applied to the select line 724 allowing the program transistor 706 to be conductive during a read operation (see FIG. 12). A read voltage Vread is applied to the word line 710a connected to the selected memory cell 708a. The source line 728 is applied a 0 volt. The potential difference between the word line 710a and the source line 728 causes current to flow through the memory cell 708a if it is in a programmed state. This current (or the read voltage), in turn, turns on the read transistor 704 and causes current to flow through the read transistor 704, which would be sensed by a load or a sense circuitry (not shown) coupled to the bit line 718. The sense circuitry may be a current sensor or a voltage sensor according to implementation.

FIG. 13 illustrates a read operation according to yet another embodiment of the present invention. The precharge operation is performed before the read operation. The precharge voltage Vpc is applied to a word line WLsel, i.e., the word line 710a, for the select memory cell 708a and word lines WLunsel, i.e., 710b and 710c, for the unselected memory cells in the memory unit 702b. The precharge voltage Vpc is also applied to the source line 728. A first select voltage Vselect is applied to the select line 724 to turn on the program transistor 706. The memory cells 708a. 708b, and 708c in the memory unit 702b are thereby placed in a precharged state. The select voltage Vselect is set to zero from the select line 724 to turn off the program transistor 706. A read voltage Vread is applied to word line 710a, and the source line 728 is applied with a zero volt. The potential difference between the word line 710a and the source line 728 would cause a current to flow if the memory cell 708a is in a programmed state. This current (or the read voltage), would increase the gate voltage of the read transistor 704, thereby turning on the read transistor 704 and causing current to flow through the read transistor 704, which would be sensed by a load or a sense circuitry (not shown) coupled to the bit line 718. The sense circuitry may be a current sensor or a voltage sensor according to implementation.

In an embodiment, a resistance state or a bit value of the selected memory cell, i.e., the resistive memory cell 708a, is determined by comparing the read current to a reference current. As noted, the memory cell can be characterized by an off-state resistance of a giga-ohm ($10^9$) range which corresponds to an off-state current of a nano-ampere ($10^{-9}$) range and an on-state resistance of a mega-ohm ($10^6$) range which corresponds to an on-state current of micro-ampere ($10^{-6}$) range.

The program, erase, and read operations described above are performed by applying appropriate voltages to word lines, bit lines, select lines, and source lines according to an operation to be performed. Below is an operation table showing the voltages applied to the word lines, bit lines, select lines, and source lines with respect to the operation to be performed according to embodiments of the present invention.

TABLE 2

| Operation | | WL 1 (e.g., 710a) Selected | WL 2, 3 (e.g., 710b, 710c) | WLs in different WL groups (e.g., 712a-c, 714a-c) | Select line | Source line | BL Selected | BL Unselected |
|---|---|---|---|---|---|---|---|---|
| Program | Precharge | 1.5 V | 1.5 V | 0 V | 3 V (pulse) | 1.5 V | 0 V | 0 V |
|  | Program cell 708a on 702b | 3 V | 1.5 V | 0 V | 3 V (pulse) | 0 V | 0 V | 0 V |
|  | Inhibit cells on 702b | 3 V | 1.5 V | 0 V | 0 V | 0 V | 0 V | 0 V |
| Erase a bit | | 0 V | 1.5 V | 0 V | 4 V (pulse) | 3 V | 0 V | 0 V |
| Erase a page | | 0 V | 0 V | 0 V | 4 V (pulse) | 3 V | 0 V | 0 V |

TABLE 2-continued

| Operation | | WL 1 (e.g., 710a) Selected | WL 2, 3 (e.g., 710b, 710c) | WLs in different WL groups (e.g., 712a-c, 714a-c) | Select line | Source line | BL Selected | BL Unselected |
|---|---|---|---|---|---|---|---|---|
| Read option 1 No precharge | | 0.5 V to 1.5 V | 0.5 V | 0 V | 0 V | 0 V | Sense Current | X |
| Read option 2 No precharge | | 0.5 V to 1.5 V | 0.5 V | 0 V | Vref~0.8 V | 0 V | Sense Current | X |
| Read option 3 | Precharge | 0.5 V | 0.5 V | 0 V | 3 V | 0.5 V | 1 V | X |
| | Read | 0.5 V to 1.5 V | 0.5 V | 0 V | 0 V | 0 V | Sense Voltage drop | X |

Figure 14:
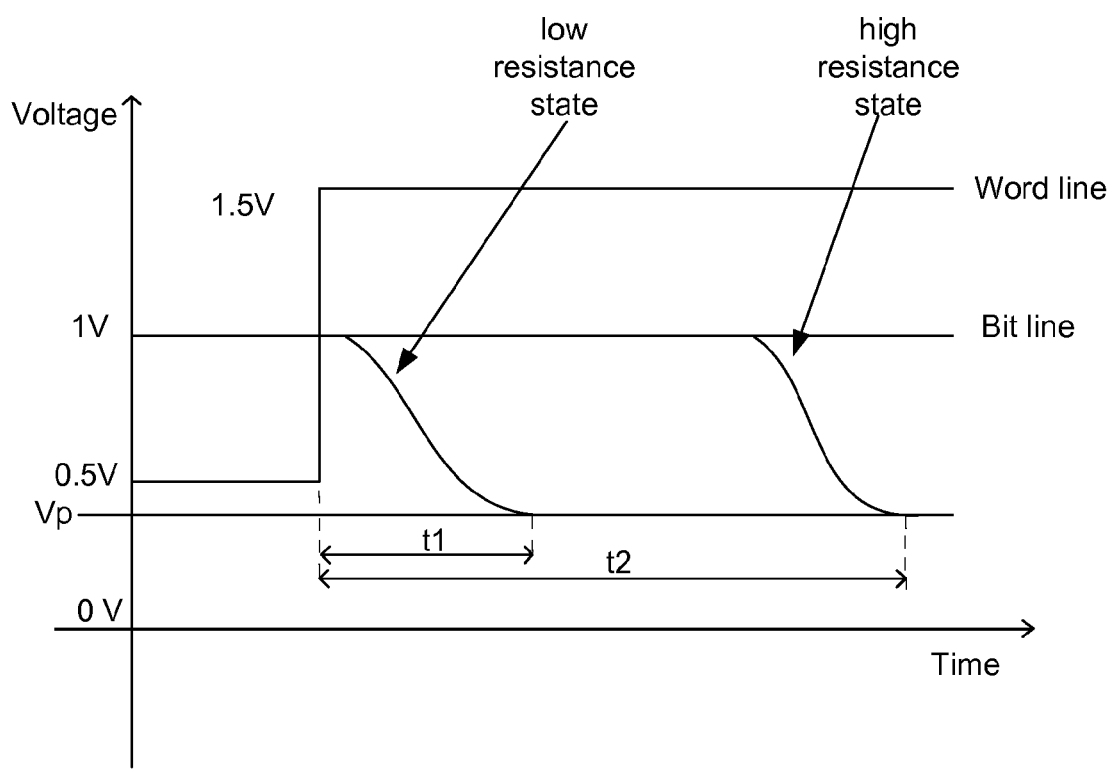
FIG. 14 illustrates a bit line sensing operation according to an embodiment of the present invention.

FIG. 14 illustrates a bit line sensing operation according to an embodiment of the present invention. In this embodiment, the resistance state of the memory device is determined by sensing the time elapsed for a voltage of the bit line 718 to drop to a predetermined value Vp. A memory cell in a low resistance state would take a first time period. e.g., t1, for the voltage drop. On the other hand, a memory cell in a high resistance state would take a second time period, e.g., t2, that is longer than the first time period for the voltage drop. The high resistance state can also be determined if the voltage drop does not occur at or after the time period t2.

In some embodiments, a sneak path can be very short, existing in as few as two forward biased cells and one reverse biased cell. In addition, once started, a sneak path can propagate throughout the array through cells in the ON state. The most common conductive path in a switching array is the shared top and bottom electrodes. Sneak path 416 is only one example of a sneak path passing leakage current through an array.

To mitigate problems caused by leakage current in a switching array, a nonlinear element (NLE) may be included in a resistive switching device. NLEs can be generally divided into two categories: an NLE that exhibits digital-like behavior, or "digital NLE," and an NLE that exhibits analog-like behavior, or an "analog NLE," both of which are described in detail separately below. The categories of digital and analog behavior are not strictly defined, so it is possible for a particular NLE to have properties that are characteristic of both digital and analog behavior, or somewhere in between. In its most basic form, an NLE is an element that has a nonlinear response with respect to voltage, for instance, with a nonlinear I-V relationship. In most embodiments, the relationship is characterized by a high resistance state at low amplitude voltages and a lower resistance state at higher amplitude voltages, with a nonlinear transition from the high resistance state to the low resistance state. Unlike a switching medium, an NLE does not have a memory characteristic; an NLE returns to an original state when a voltage is no longer applied. An NLE that is suitable for suppressing leak currents is characterized by a high resistance state at a low bias, a lower resistance state at a higher bias, and a threshold between the states.

In an embodiment, an NLE is a two terminal device which shows an apparent threshold effect such that the resistance measured below a first voltage is significantly higher than the resistance measured above a second voltage. In a typical embodiment, the resistance below the first voltage is more than 100 times greater than the resistance above the second voltage. In some embodiments, the first and second voltages are different, and are typically referred to as a hold voltage $V_{HOLD}$ and threshold voltage $V_{TH}$, respectively. In other embodiments, the first voltage and second voltage may be the same. In various embodiments, these relationships may exist in both polarities of voltage, or only in one polarity, and the NLE can be a single material or multiple layers of different materials.

Figure 15:
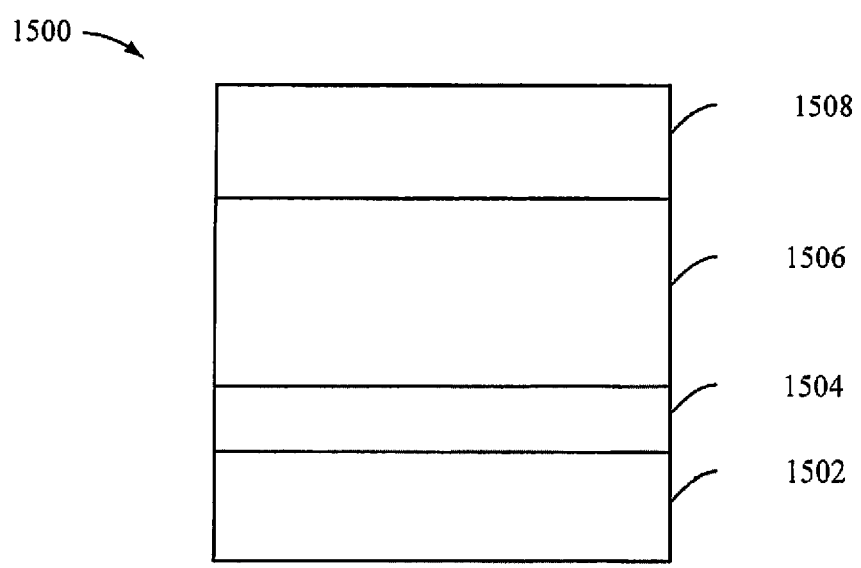
FIG. 15 illustrates a non-volatile memory cell including a nonlinear element according to an embodiment of the present invention.

As shown in FIG. 15, to mitigate the effects of leakage current in a memory cell 1500, an NLE 1504 is electrically coupled in series to the top electrode 1508, bottom electrode 1502, and switching medium 1506. An NLE 1504 may be disposed between the bottom electrode 1502 and switching medium 1506. In other embodiments, the NLE is disposed between the top electrode 1508 and the switching medium 1506. Higher temperatures may be experienced by the lower portions of a semiconductor device during various semiconductor processes, so an NLE that is located lower in a stack structure may be designed to withstand higher temperatures than an NLE located further from the substrate.

Figure 16A:
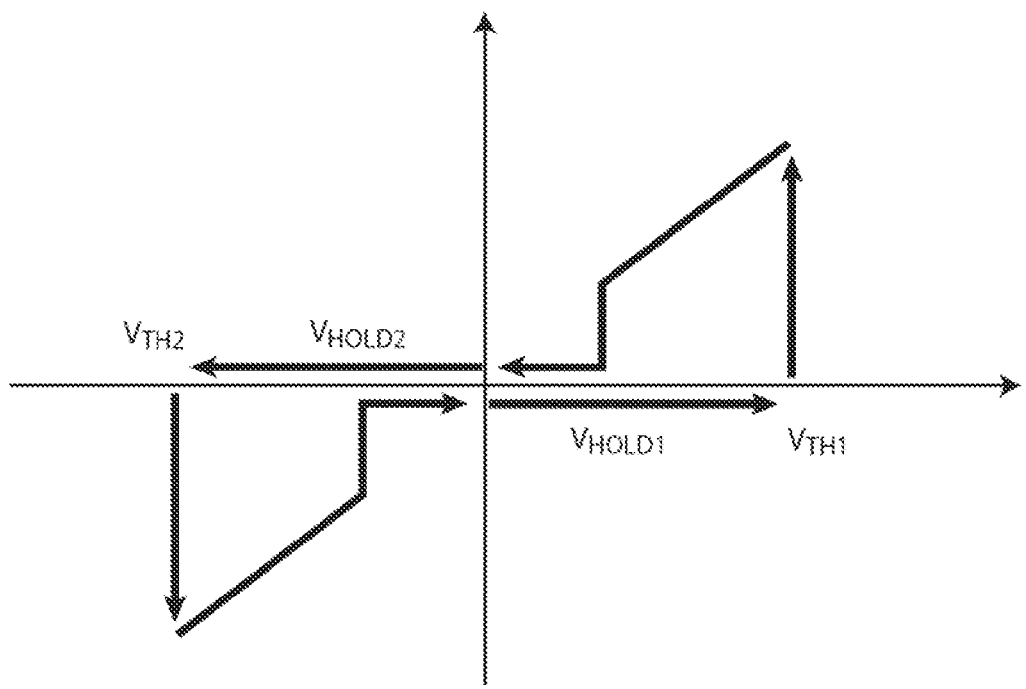
FIG. 16A illustrates I-V characteristics of a digital nonlinear element subjected to a voltage sweep.

The behavior of a digital NLE is characterized by abrupt changes in current at certain voltages, which may be referred to as threshold voltages. Such behavior is illustrated in FIG. 16A, which shows the results of a voltage sweep in an embodiment with respect to current on an NLE that is not coupled to a resistive switching device. As positive bias voltage is applied to the NLE, the NLE is in a resistive state characterized by high resistance until it reaches the threshold voltage $V_{TH}$. After this threshold has been reached, the NLE will retain its conductive state until the applied voltage drops below a hold voltage $V_{HOLD}$. Thus a NLE that is in a conductive state by having a voltage applied above $V_{TH1}$ will continue to have a low resistance so long as a voltage above $V_{HOLD1}$ is supplied to the NLE, after which it reverts to the original high-resistance state. An NLE does not have a memory characteristic, so the same I-V relationship is experienced every time a voltage is applied from an original state.

Referring back to FIG. 16A, when a negative bias voltage is applied that is more negative than a threshold voltage $V_{TH2}$, an abrupt transition is experienced, and the resistance in the NLE is significantly reduced. The NLE retains its low resistance state until the voltage becomes less negative than a value $V_{HOLD2}$, at which point the NLE reverts to an original high resistance state. Although FIG. 16A shows an embodiment with symmetrical I-V behavior between positive and negative bias performance, in other embodiments the relationship is not symmetrical.

Figure 16B:
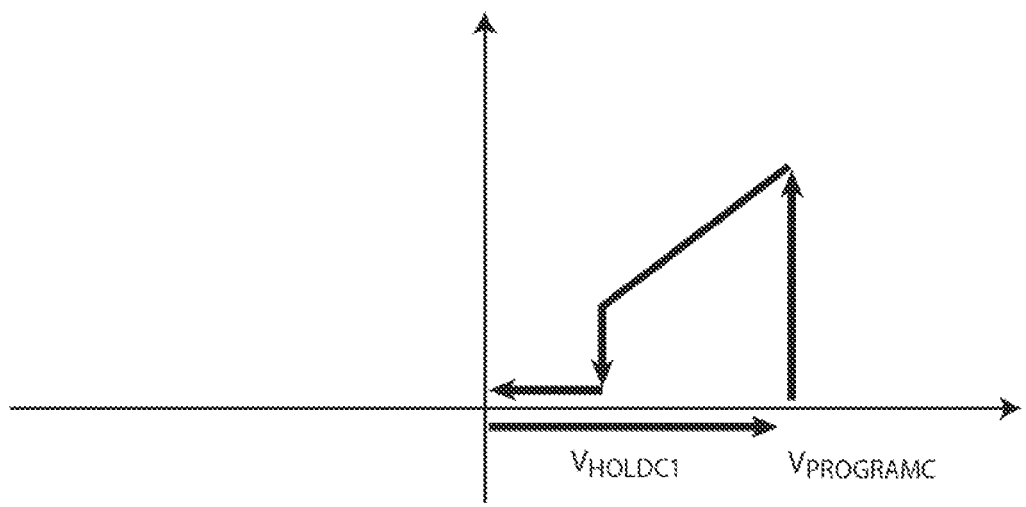
FIG. 16B illustrates I-V characteristics of a switch combined with a digital nonlinear element in an initially OFF state subjected to a positive voltage sweep.

FIGS. 16B to 16E show I-V relationships of an embodiment where an NLE is coupled to a memory cell ("combined device"), in this case a digital NLE. Memory cell 1500 is an example of such a combined device. If the memory cell depicted in those figures was not coupled to the NLE, it would have an I-V response according to FIG. 2A. Turning to FIG. 16B, an I-V curve showing a program operation switching a cell from an initially OFF state to an ON state is shown. To establish a conductive ON state in a cell, a voltage above $V_{PROGRAMC}$ is applied. $V_{PROGRAMC}$ is the program voltage for the combined device, which switches the combined device from an OFF state to an ON state. $V_{HOLDC1}$ is the hold voltage of a combined device, which performs in essentially the same way as $V_{HOLD1}$ described above. In a preferred embodiment. $V_{HOLD1}$ is less than $V_{TH1}$, which is less than $V_{PROGRRAM}$.

The relationships between I-V performance in a memory cell, an NLE, and a combined device can also be explained through equations. The equations assume that both the NLE and the switching medium switch instantly (e.g., a few ns~a few hundreds of ns) when experiencing a threshold voltage. In addition to the definitions given above, the following variables are designated:

$R_{MOFF}$=The OFF state resistance of a memory element
$R_{MON}$=The ON state resistance of a memory element
$R_{NOFF}$=The OFF state resistance of an NLE
$R_{NON}$=The ON state resistance of an NLE Using these variables, the relationship between the hold voltage of a combined device and the hold voltage of an NLE can be expressed as:

$$V_{HOLDC1} = \frac{R_{MON} + R_{NON}}{R_{NON}} V_{HOLD1}$$

The value for the program voltage of the combined device can be expressed as:

$$V_{PROGRAMC} \cong \text{small}\left\{\text{large}\left(\frac{R_{MOFF} + R_{NOFF}}{R_{NOFF}} V_{TH1}, V_{PROGRAM}\right),\right.$$
$$\left.\text{large}\left(V_{TH1}, \frac{R_{MOFF} + R_{NOFF}}{R_{MOFF}} V_{PROGRAM}\right)\right\}$$

Where "small" indicates the smaller of two values in a set, and "large" indicates the larger of two values in a set. In most embodiments, the $V_{PROGRAM}$ is significantly higher than $V_{TH1}$, and $V_{PROGRAMC}$ is thus similar to $V_{PROGRAM}$.

Figure 16C:
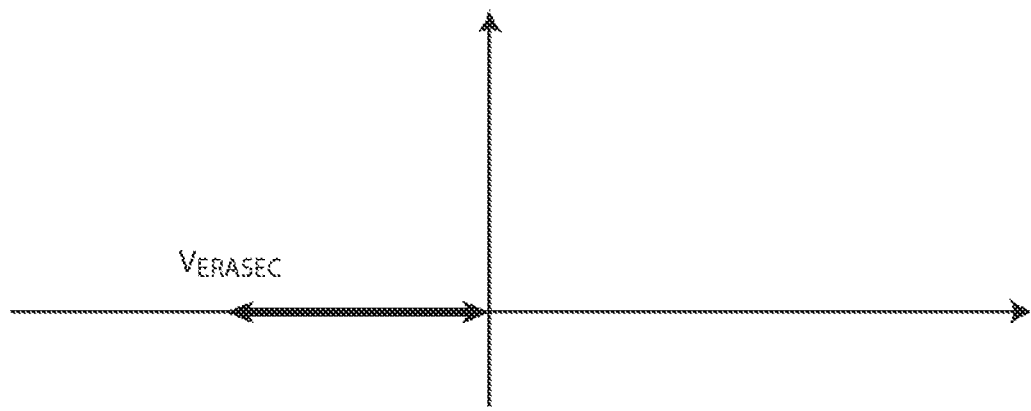
FIG. 16C illustrates I-V characteristics of a switch combined with a digital nonlinear element in an initially OFF state subjected to a negative voltage sweep.

FIG. 16C shows the result of a negative voltage sweep of the same switch in an OFF state. Because it is already in the OFF state, a negative voltage does not cause an erase operation, and the cell remains in a high resistance OFF state.

Figure 16D:
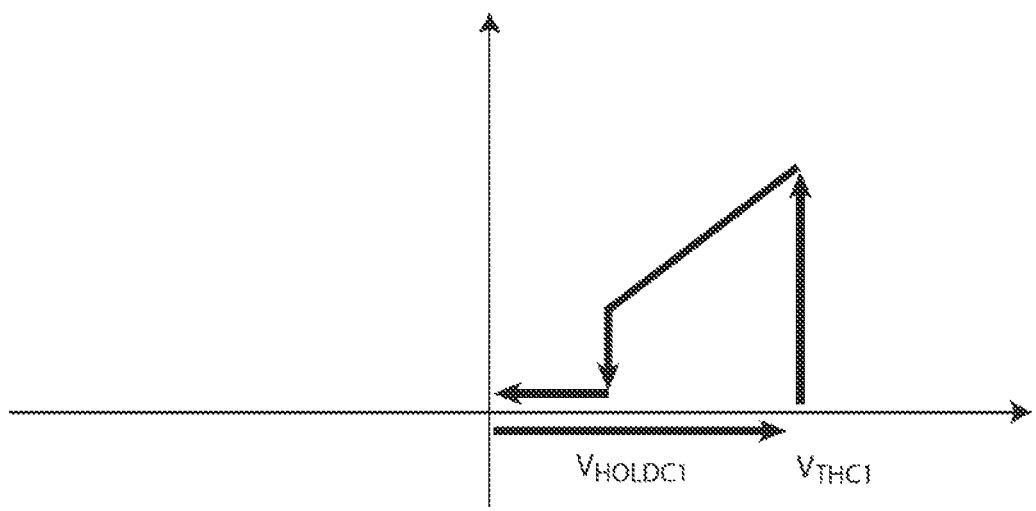
FIG. 16D illustrates I-V characteristics of a switch combined with a digital nonlinear element in an initially ON state subjected to a positive voltage sweep.
Figure 16E:
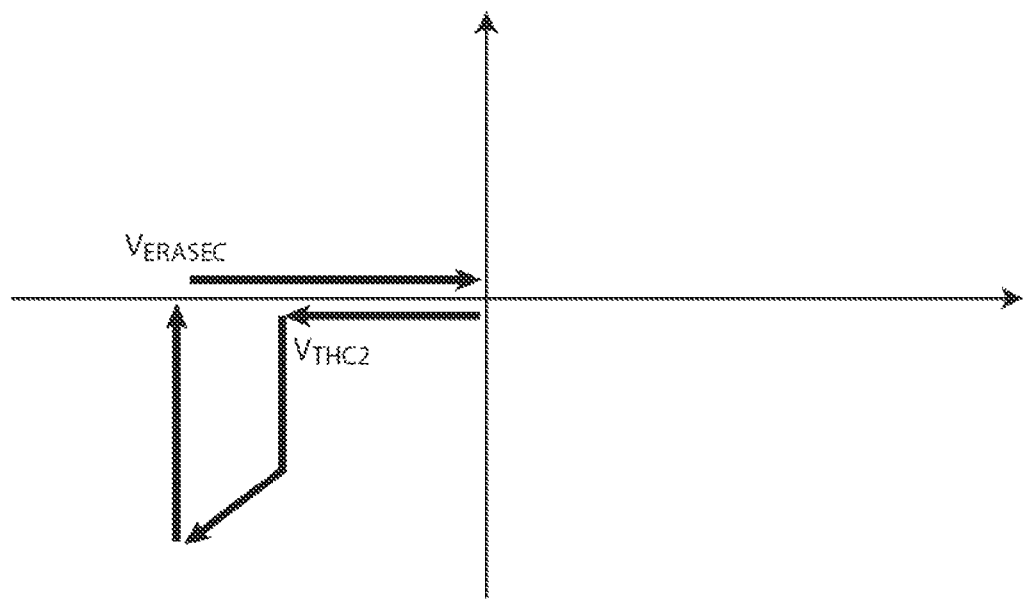
FIG. 16E illustrates I-V characteristics of a switch combined with a digital nonlinear element in an initially ON state subjected to a negative voltage sweep.

FIGS. 16D and 16E show I-V relationships of a combined device (e.g. memory cell 1500) where the memory cell is initially in a low-resistance ON state. FIG. 16D shows a read operation, where the read voltage must be greater than threshold voltage $V_{THC1}$ to return an accurate read value. As the read voltage drops below the hold voltage $V_{HOLDC1}$, the resistance in the cell increases substantially. The threshold voltage of the combined device is related to the threshold voltage of the NLE through the following equation:

$$V_{THC1} = \frac{R_{MON} + R_{NOFF}}{R_{NOFF}} V_{TH1} \cong V_{TH1}$$

Thus, the read threshold voltage of the combined device is approximately the same as the threshold voltage of the NLE, or $V_{THC1} \approx V_{TH1}$.

Similarly, as seen in FIG. 16E, an erase operation must overcome a second threshold value $V_{THC2}$ to allow current to start flowing through the cell, and the switch is changed to a high-resistance OFF state at voltage $V_{ERASEC}$. Like the positive threshold voltage, the negative threshold voltage of the combined device is about the same as the negative threshold voltage of the NLE. The value of the erase voltage $V_{ERASEC}$ in a combined device can be expressed as:

$$V_{ERASEC} \cong \text{large}\left(\frac{R_{MON} + R_{NON}}{R_{MON}} V_{ERASE}, V_{Th2}\right)$$

The relationship between the negative threshold voltages of a discrete and combined device can be expressed as:

$$V_{THC2} = \frac{R_{MON} + R_{NOFF}}{R_{NOFF}} V_{TH2} \cong V_{TH2}$$

So that in most embodiments, $V_{THC2} \approx V_{TH2}$.

Various embodiments of a digital NLE can be made of many different materials. For example, a digital NLE can be a threshold device such as a film that experiences a field-driven metal-insulating (Mot) transition. Such materials are known in the art, and include $VO_2$ and doped semiconductors. Other threshold devices include material that experiences resistance switching due to electronic mechanisms observed in metal oxides and other amorphous films, or other volatile resistive switching devices such as devices based on anion or cation motion in oxides, oxide heterostructures, or amorphous films. A digital NLE can also be in the form of a breakdown element exhibiting soft breakdown behavior such as $SiO_2$, $HfO_2$, and other dielectrics. Examples of such breakdown elements are described in further detail by application Ser. No. 12/826,653, filed on Jun. 29, 2010, which is entitled "Rectification Element for Resistive Switching for Non-volatile Memory Device and Method." and is incorporated by reference in its entirety. This reference discloses that additional materials may be used for a switching medium, for a NLE, for electrodes, and the like. In light of that disclosure, embodiments of the present invention may have a switching medium that includes: metal oxides such as ZnO, WO3, TiOx. NiO, CuO, or chalcogenide glass, organic materials, polymeric materials (inorganic or organic), and others. Additionally, in light of this disclosure, embodiments of the present invention may have an NLE that includes: an oxide dielectric material such as HfO2, a dielectric material or a combination of dielectric materials. Further, in light of this disclosure, the electrodes may be a metal or an alloy.

As is known in the art, the precise values of threshold, hold, program and erase can be adjusted for different embodiments by changing the form of and materials used for the NLE and the memory cell. In various embodiments the threshold voltage for the NLE can be about the same as the hold voltage, the program voltage, or both. In other embodiments the threshold voltage for the NLE can exceed the program and erase voltages of a resistive switching device.

Figure 17A:
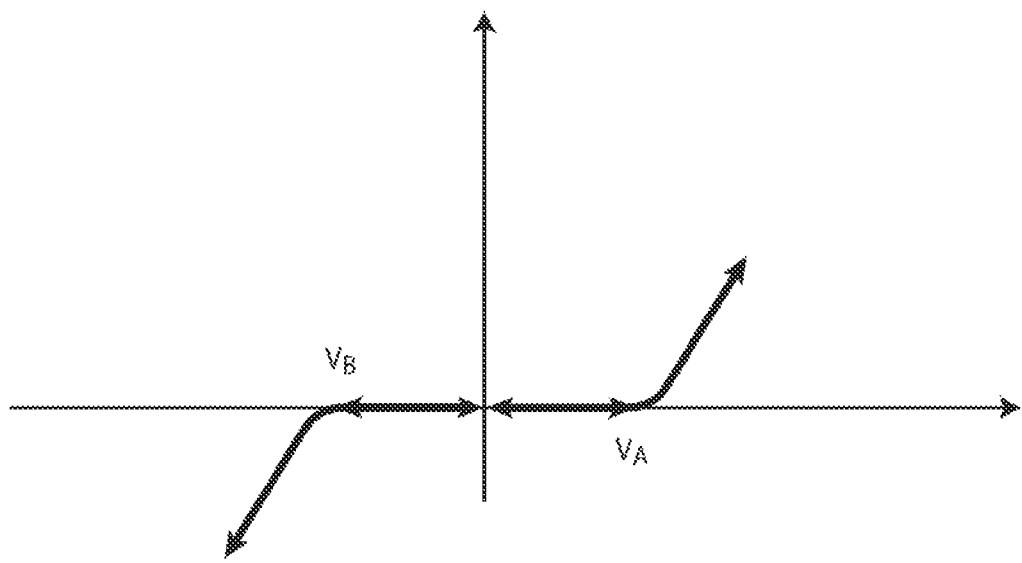
FIG. 17A illustrates I-V characteristics of an analog nonlinear element subjected to a positive voltage sweep.
Figure 17B:
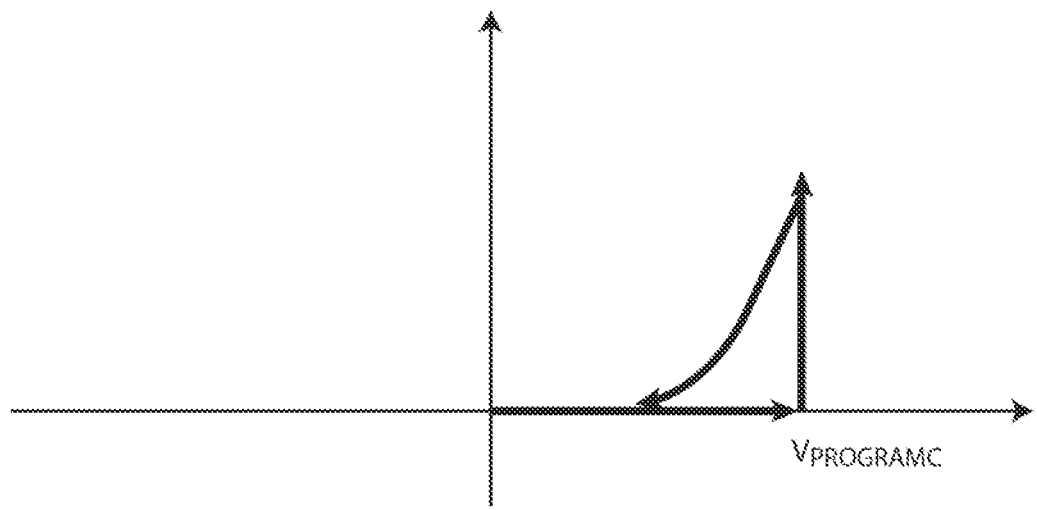
FIG. 17B illustrates I-V characteristics of a switch combined with an analog nonlinear element in an initially OFF state subjected to a positive voltage sweep.

An analog NLE differs from a digital NLE in that its I-V relationship is characterized by a more gradual transition when current starts to flow through the element. As shown in FIG. 17A, which illustrates the response of an analog NLE to a voltage sweep, the current transition follows an exponential-like curve. The transition or threshold is therefore less abrupt than a digital NLE. Threshold voltage values where substantial current starts to flow through an analog NLE are designated as $V_A$ and $V_B$ for positive and negative bias values, respectively. Another significant difference between an analog and digital NLE is that an analog NLE does not experience the hysteric hold voltage characteristic of a digital NLE.

FIGS. 17B to 17E show I-V characteristics of a combined device with an analog NLE. As shown in FIG. 173, when a program voltage $V_{PROGRAMC}$ is applied to a combined device where the switch is initially in an OFF state, the switch changes to a low resistance ON state. The $V_{PROGRAMC}$ is approximately the sum of the $V_A$ of the NLE and the $V_{PROGRAM}$ of the switch as shown in FIG. 2A, or $V_{PROGRAMC} \approx V_A + V_{PROGRAM}$. As a result, the programming voltage of a combined device with an analog NLE is typically higher than the programming voltage of a switching element alone.

Figure 17C:
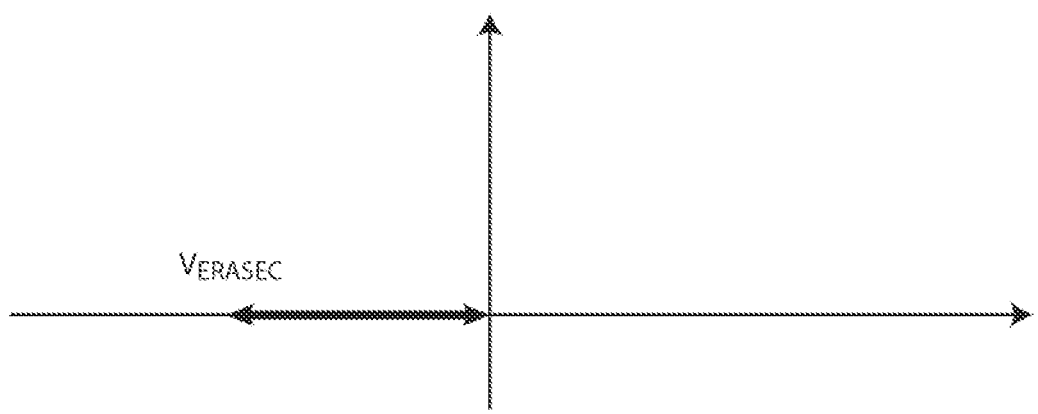
FIG. 17C illustrates I-V characteristics of a switch combined with an analog nonlinear element in an initially OFF state subjected to a negative voltage sweep.

Turning now to FIG. 17C, a negative voltage sweep of a combined device in an OFF state is shown. Because the switch is already in an OFF state, the negative voltage does not induce a state change, and the switch remains in a high resistance state.

Figure 17D:
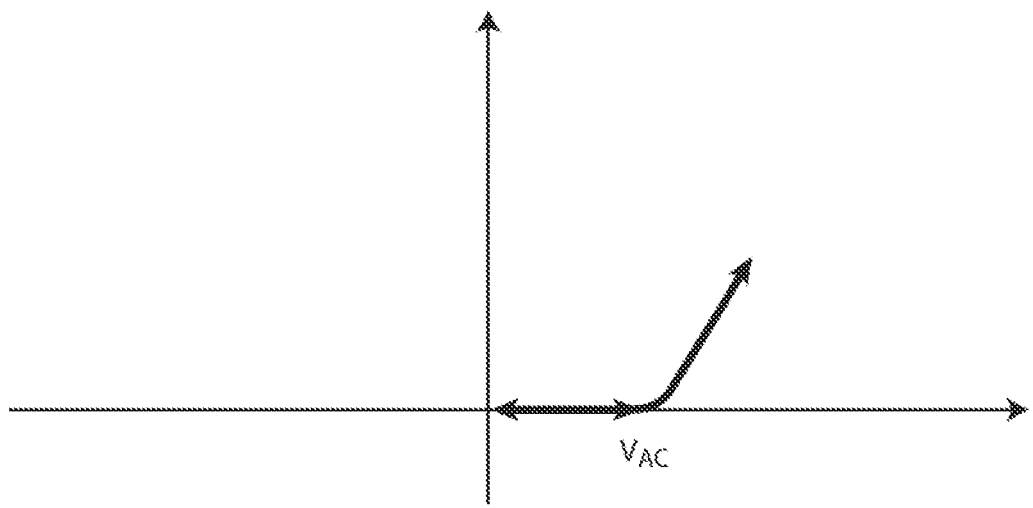
FIG. 17D illustrates I-V characteristics of a switch combined with an analog nonlinear element in an initially ON state subjected to a positive voltage sweep.

FIG. 17D shows the result of a read operation in a combined switch that is in an ON state. In the present embodiment, $V_{AC} < V_{RRAD} < V_{PROGRAMC}$. Because the switch is already in a low-resistance ON state, current flow above the threshold voltage $V_{AC}$ is characterized by low resistance. Circuitry can detect the current flow, resulting in a positive read result. The value for $V_A$ is not affected by the switching apparatus in most embodiments, so typically $V_{AC} \approx V_A$.

Figure 17E:
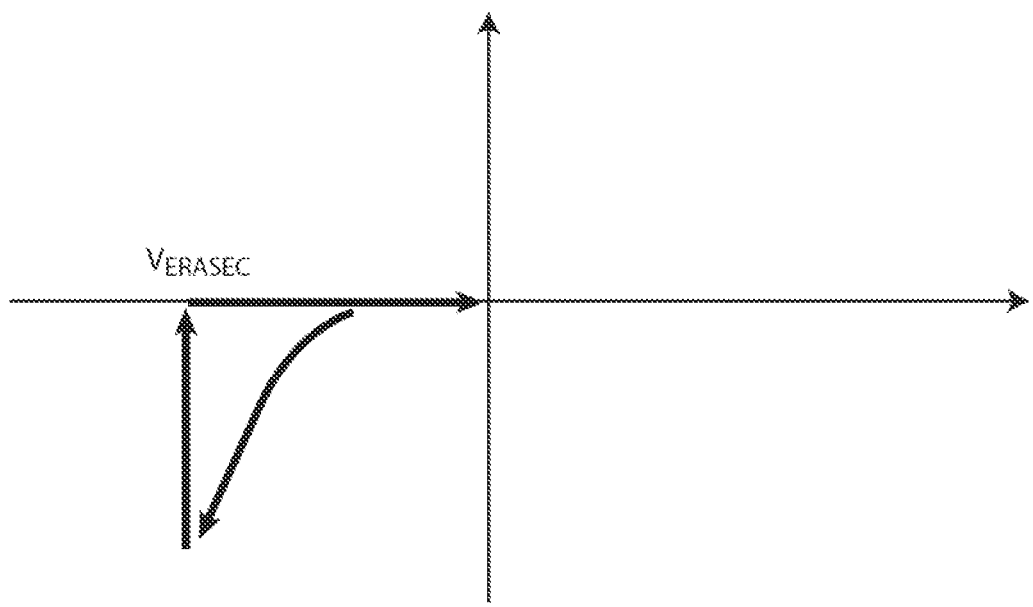
FIG. 17E illustrates I-V characteristics of a switch combined with an analog nonlinear element in an initially ON state subjected to a negative voltage sweep.

FIG. 17E shows an I-V curve for an erase operation in a combined device. To change the switch from the ON state to the OFF state, a voltage of $V_{ERASEC}$ is applied to the combined device, thereby increasing the resistance of the switch. The voltage required to complete an erase operation in a combined device is normally the sum of the erase value of the discrete switch and the threshold value of the analog NLE, or $V_{ERASRC} \approx V_{ERASE} + V_B$.

An analog NLE can be any element that exhibits the above described behavior. Examples of suitable materials include a punch-through diode, a Zener diode, an impact ionization (or avalanche) element, and a tunneling element such as a tunneling barrier layer. Such elements can be fabricated using standard fabrication techniques.

In most embodiments, $|V_A, V_B| < |V_{PROGRAM}, V_{ERASE}|$. As is known in the art, the precise threshold values of $V_A$, $V_B$, program, and erase can be adjusted for different embodiments by changing the form of and materials used for the NLE and the memory cell. In various embodiments the threshold voltage for the NLE can be about the same as the program voltage. In other embodiments the threshold voltage can exceed the program and erase voltages.

In other embodiments, a resistive switching cell may be configured to retain multiple resistive states. That is, rather than being configured to have binary states of ON and OFF, a cell can retain a plurality of resistance states. An array of such switches has the same limitations regarding leakage current, and would similarly benefit from the inclusion of an NLE.

The examples and embodiments described herein are for illustrative purposes only and are not intended to be limiting. Various modifications or alternatives in light thereof will be suggested to persons skilled in the art and are to be included within the spirit and purview of this application and scope of the appended claims.

A number of embodiments have been described. It will be understood that various modifications may be made without departing from the spirit and scope of the present invention. For example, the memory units may be provided with two-terminal memory cells other than resistive memory cells, e.g., phase-change memory (PCRAM), magnetoresistive random access memory (MRAM), and spin-transfer torque RAM (SIT-RAM). The scope of the present invention should be defined using the appended claims.

What is claimed is:

1. A non-volatile memory device, comprising:
a word line extending along a first direction;
a bit line extending along a second direction;
a memory unit having a read transistor coupled to the bit line, at least one resistive memory cell comprising a resistive memory device in series with a selector device, and a select transistor, the at least one resistive memory cell having a first end coupled to the word line and a second end coupled to a gate electrode of the read transistor.

2. The device of claim 1, wherein the second end is coupled to a common node shared by a drain electrode of the select transistor and the gate electrode of the read transistor.

3. The device of claim 2, wherein the device has a plurality of word lines, and wherein the memory unit has a plurality of resistive memory cells, each resistive memory cell having the first end coupled to one of the word lines and the second end coupled to the common node.

4. The device of claim 3, further comprising:
a source line coupled to a source electrode of the select transistor; and
a select line coupled to a gate electrode of the select transistor.

5. The device of claim 4, further comprising:
the word line being one of the plurality of word lines, wherein the plurality of word lines has a first group of word lines, a second group of word lines, and a third group of word lines;
a plurality of memory units, the memory unit being one of the plurality of memory units, wherein the plurality of memory units has a first row of memory units, a second row of memory units, and a third row of memory units, and
wherein the first group of word lines is associated with the first row of memory units, the second group of word lines is associated with the second row of memory units, and the third group of word lines is associated with the third row of memory units.

6. The device of claim 5, wherein each memory unit includes a plurality of resistive memory cells, each memory cell in each memory unit having one end connected to one of the word lines and the other end connected to the common node.

7. The device of claim 6, wherein the resistive memory cells in each memory unit are configured to be accessed independently from other resistive memory cells in the same memory unit.

8. The device of claim 7, where in each resistive memory cell includes a top electrode, a switching medium, and a bottom electrode, wherein the top electrode includes silver, the switching medium includes amorphous silicon, and the bottom electrode includes polysilicon.

9. The device of claim 8, wherein a resistive memory cell is configured to have a high resistance state and a low resistance state.

10. The device of claim 1, wherein the at least one resistive memory cell is an amorphous-silicon-based resistive memory cell.

11. The device of claim 1, further comprising:
a source line coupled to a source electrode of the select transistor; and a select line coupled to a gate electrode of the select transistor, wherein the second end of the at least one resistive memory cell is coupled to a common node shared by a drain electrode of the select transistor and the gate electrode of the read transistor, wherein the device has a plurality of word lines, and wherein the memory unit has a plurality of resistive memory cells, each resistive memory cell having a first end coupled to one of the word lines and a second end coupled to the common node, and wherein each resistive memory cell includes a switching medium provided between the first and second ends, wherein the first end includes silver, the switching medium includes amorphous silicon, and the second end includes poly silicon.

12. A non-volatile memory device, comprising:

a plurality of memory units arranged in an array of rows and columns, each memory unit having a plurality of resistive memory cells, each resistive memory cell having a first end and a second end;

a plurality of word lines extending along a first direction and having a first group of word lines associated with a first row of memory units, a second group of word lines associated with a second row of memory units, and a third group of word lines associated with a third row of memory units;

a plurality of bit lines extending along a second direction and having a first bit line associated with a first column of memory units, a second bit line associated with a second column of memory units, and a third bit line associated with a third column of memory units;

a plurality of read transistors, each read transistor being associated with one of the memory units and having a drain electrode coupled to one of the bit lines;

a plurality of select transistors, each select transistor being associated with one of the memory units;

a plurality of select lines having a first select line coupled to gate electrodes of the select transistors associated with the first column of memory units, a second select line coupled to gate electrodes of the select transistors associated with the second column of memory units, and a third select line coupled to gate electrodes of the select transistors associated with the third column of memory units; and a plurality of source lines having a first source line coupled to source electrodes of select transistors associated with the first row of memory units, a second source line coupled to source electrodes of select transistors associated with the second row of memory units, and a third source line coupled to source electrodes of select transistors associated with the third row of memory units; wherein:

the first ends of the resistive memory cells are coupled to the corresponding word lines and the second ends of the resistive memory cells are coupled to corresponding common nodes, each common node being shared by the drain electrode of one of the select transistor and the gate electrode of the corresponding read transistor.

13. The non-volatile memory device of claim 12, wherein a resistive memory cell of the plurality of resistive memory cells includes a resistive switching device in series with a selector device.

14. The non-volatile memory device of claim 13, wherein the resistive memory device is a non-volatile resistive memory.

15. The non-volatile memory device of claim 13, wherein the resistive memory device comprises a top electrode, a switching medium and a bottom electrode.

16. The non-volatile memory device of claim 15, wherein the top electrode comprises a metal selected from a group consisting of: aluminum, nickel, gold, chromium, iron, manganese, tungsten, vanadium and cobalt.

17. The non-volatile memory device of claim 15, wherein the top electrode is silver.

18. The non-volatile memory device of claim 15, wherein the switching medium contains amorphous silicon.

19. The non-volatile memory device of claim 13, wherein the resistive memory cell can be controlled to exhibit either rectifying or non-rectifying characteristics in response to an amount of current flowing through the resistive memory cell.

* * * * *